(12) United States Patent
Nishimura et al.

(10) Patent No.: US 9,704,840 B2
(45) Date of Patent: Jul. 11, 2017

(54) OPTICAL SEMICONDUCTOR DEVICE

(71) Applicant: ROHM CO., LTD., Kyoto (JP)

(72) Inventors: Isamu Nishimura, Kyoto (JP); Makoto Murata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/226,743

(22) Filed: Aug. 2, 2016

(65) Prior Publication Data

US 2017/0053903 A1 Feb. 23, 2017

(30) Foreign Application Priority Data

Aug. 17, 2015 (JP) .................................. 2015-160385

(51) Int. Cl.
*H01L 31/12* (2006.01)
*H01L 33/00* (2010.01)
(Continued)

(52) U.S. Cl.
CPC ............ *H01L 25/167* (2013.01); *G01S 7/481* (2013.01); *H01L 25/50* (2013.01); *H01L 31/12* (2013.01);
(Continued)

(58) Field of Classification Search
CPC ..... H01L 31/125; H01L 31/153; H01L 25/50; G01S 7/481
(Continued)

(56) References Cited

U.S. PATENT DOCUMENTS

2012/0128295 A1* 5/2012 Lim .................... G02B 6/4246
385/24
2013/0341650 A1* 12/2013 Peng ...................... H01L 23/31
257/82
(Continued)

FOREIGN PATENT DOCUMENTS

JP 2010-275991 A 12/2010

*Primary Examiner* — David Vu
*Assistant Examiner* — Brandon Fox
(74) *Attorney, Agent, or Firm* — Hamre, Schumann, Mueller & Larson, P.C.

(57) ABSTRACT

The present invention provides an optical semiconductor device for improving minimization and increase of detection precision. An optical semiconductor device A1 of the present invention includes: a substrate 1, including a semiconductor material, and including a main surface 111 and a back surface 112; a semiconductor light-emitting element 7A at the substrate; a semiconductor light-receiving element 7B at the substrate; a conductive layer 3, conducting the semiconductor light-emitting element 7A and the semiconductor light-receiving element 7B; and an insulating layer 2 between at least a portion of the conductive layer 3 and the substrate; wherein the substrate 1 includes a recess 14 recessed from the main surface 111 and including a bottom surface 142A of a light-emitting side recess where the semiconductor light-emitting element 7A is disposed, and a bottom surface 142B of a light-receiving side recess where the semiconductor light-receiving element 7B is disposed; a light-emitting side transparent portion 18A for light from the semiconductor light-emitting element 7A to pass through the bottom surface 142A of the light-emitting side recess to the back surface 112; and a light-receiving side transparent portion 18B for light from the back surface 112 to pass through the bottom surface 142B of the light-receiving side recess to the semiconductor light-receiving element 7B.

20 Claims, 30 Drawing Sheets

(51) Int. Cl.
*H01L 25/16* (2006.01)
*H01L 33/62* (2010.01)
*H01L 33/54* (2010.01)
*H01L 33/56* (2010.01)
*H01L 31/153* (2006.01)
*H01L 25/00* (2006.01)
*G01S 7/481* (2006.01)

(52) U.S. Cl.
CPC .......... *H01L 31/125* (2013.01); *H01L 31/153* (2013.01); *H01L 33/54* (2013.01); *H01L 33/56* (2013.01); *H01L 33/62* (2013.01); *H01L 2933/0033* (2013.01)

(58) Field of Classification Search
USPC ..................................................... 257/81, 82
See application file for complete search history.

(56) References Cited

U.S. PATENT DOCUMENTS

| | | | |
|---|---|---|---|
| 2014/0191253 A1* | 7/2014 | Haslbeck | H01L 31/02325 257/82 |
| 2014/0231635 A1* | 8/2014 | Kerness | G01S 17/026 250/226 |
| 2015/0054001 A1* | 2/2015 | Oganesian | H04N 5/2256 257/82 |
| 2015/0226839 A1* | 8/2015 | Brandl | H01L 25/167 250/221 |

* cited by examiner

OPTICAL SEMICONDUCTOR DEVICE

BACKGROUND

The present invention is related to an optical semiconductor device.

An optical semiconductor device having a semiconductor light-emitting element and a semiconductor light-receiving element is widely used. The optical semiconductor device disclosed in the patent literature 1 detects whether there is a detection object in a specific area near the optical semiconductor device according to whether the semiconductor light-receiving element receives light from the semiconductor light-emitting element. In the situation that the semiconductor light-receiving element receives from the semiconductor light-emitting element directly, if the semiconductor light-receiving element received no light from the semiconductor light-emitting element, it is considered that there exists a detection object. However, in the situation that the semiconductor light-receiving element receives light from the semiconductor light-emitting element by reflection, if the semiconductor light-receiving element received light from the semiconductor light-emitting element, it is considered that there exists a detection object.

In the optical semiconductor device, it is required to improve miniaturization and enhance precision of detection.

BACKGROUND TECHNICAL LITERATURES

Patent Literatures

[Patent literature 1] Japanese patent application publication No. 2010-275991

BRIEF SUMMARY OF THE INVENTION

Problems to be Solved in the Present Invention

According to the above situations, the present invention provides an optical semiconductor device for improving miniaturization and enhancing precision of detection.

Technical Means for Solving Problems

The optical semiconductor device provided by the present invention includes: a substrate, including a semiconductor material, and including a main surface and a back surface facing oppositely in a thickness direction; a semiconductor light-emitting element, disposed at the substrate; a semiconductor light-receiving element, disposed at the substrate; a conductive layer, conducting the semiconductor light-emitting element and the semiconductor light-receiving element; and an insulating layer, disposed between at least a portion of the conductive layer and the substrate; wherein the substrate includes a recess recessed from the main surface and including a bottom surface of a light-emitting side recess where the semiconductor light-emitting element is disposed, and a bottom surface of a light-receiving side recess where the semiconductor light-receiving element is disposed; a light-emitting side transparent portion for light from the semiconductor light-emitting element to pass through the bottom surface of the light-emitting side recess to the back surface; and a light-receiving side transparent portion for light from the back surface to pass through the bottom surface of the light-receiving side recess to the semiconductor light-receiving element.

In a preferred embodiment of the present invention, the bottom surface of the light-emitting side recess and the bottom surface of the light-receiving side recess are separated from each other.

In a preferred embodiment of the present invention, the recess of the substrate includes a first side surface of the light-emitting side recess rising from the bottom surface of the light-emitting side recess.

In a preferred embodiment of the present invention, the recess of the substrate includes a first side surface of the light-receiving side recess rising from the bottom surface of the light-receiving side recess.

In a preferred embodiment of the present invention, the optical semiconductor device comprises a light-shielding layer disposed between the substrate and at least a portion of the insulating layer, and the light-shielding layer shields light from the semiconductor light-emitting element and light to be received by the semiconductor light-receiving element.

In a preferred embodiment of the present invention, the light-shielding layer includes a compound of a metal and a semiconductor constituting the substrate.

In a preferred embodiment of the present invention, the light-shielding layer includes a compound of Ti and Si.

In a preferred embodiment of the present invention, the light-shielding layer includes a metal.

In a preferred embodiment of the present invention, the light-shielding layer includes Ti.

In a preferred embodiment of the present invention, the light-shielding layer includes a light-shielding portion of a recess inner surface, and the light-shielding portion of the recess inner surface is formed on the recess of the substrate.

In a preferred embodiment of the present invention, the light-shielding portion of the recess inner surface includes a light-emitting side opening for light from the semiconductor light-emitting element to pass through, and the light-emitting side opening accommodates the light-emitting side transparent portion from a top view perspective.

In a preferred embodiment of the present invention, the light-shielding portion of the recess inner surface includes a light-receiving side opening for light toward the semiconductor light-receiving element to pass through, and the light-receiving side opening accommodates the light-receiving side transparent portion from a top view perspective.

In a preferred embodiment of the present invention, the optical semiconductor device comprises a light-emitting side transparent film in the light-emitting side transparent portion, and the light-emitting side opening of the light-shielding layer accommodates the light-emitting side transparent film from a top view perspective.

In a preferred embodiment of the present invention, an outer edge of the light-emitting side transparent film aligns with an inner edge of the light-emitting side opening of the light-shielding layer.

In a preferred embodiment of the present invention, the light-emitting side transparent film includes $SiO_2$.

In a preferred embodiment of the present invention, the optical semiconductor device comprises a light-receiving side transparent film in the light-receiving side transparent portion, and the light-receiving side opening of the light-shielding layer accommodates the light-receiving side transparent film from a top view perspective.

In a preferred embodiment of the present invention, an outer edge of the light-receiving side transparent film aligns with an inner edge of the light-receiving side opening of the light-shielding layer.

In a preferred embodiment of the present invention, the light-receiving side transparent film includes $SiO_2$.

In a preferred embodiment of the present invention, the substrate includes a light-emitting side through hole in the light-emitting side transparent portion, wherein the light-emitting side through hole passes from the bottom surface of the light-emitting side recess to the back surface, and the light-emitting side opening of the light-shielding layer accommodates at least a portion of the light-emitting side through hole from a top view perspective.

In a preferred embodiment of the present invention, the light-emitting side through hole includes a light-emitting side main surface opening disposed on the main surface side and a light-emitting side back surface opening disposed on the back surface side in the thickness direction of the substrate.

In a preferred embodiment of the present invention, the light-emitting side main surface opening is in contact with the light-emitting side transparent film, and the light-emitting side transparent film accommodates the light-emitting side main surface opening from a top view perspective.

In a preferred embodiment of the present invention, the light-emitting side main surface opening is accommodated in the light-emitting side back surface opening from a top view perspective.

In a preferred embodiment of the present invention, the substrate includes a light-receiving side through hole in the light-receiving side transparent portion, wherein the light-receiving side through hole passes from the bottom surface of the light-receiving side recess to the back surface, and the light-receiving side opening of the light-shielding layer accommodates at least a portion of the light-receiving side through hole from a top view perspective.

In a preferred embodiment of the present invention, the light-receiving side through hole includes a light-receiving side main surface opening disposed on the main surface side and a light-receiving side back surface opening disposed on the back surface side in the thickness direction of the substrate.

In a preferred embodiment of the present invention, the light-receiving side main surface opening is in contact with the light-receiving side transparent film, and the light-receiving side transparent film accommodates the light-receiving side main surface opening from a top view perspective.

In a preferred embodiment of the present invention, the light-receiving side main surface opening is accommodated in the light-receiving side back surface opening from a top view perspective.

In a preferred embodiment of the present invention, the optical semiconductor device includes a back coating layer for covering the back surface.

In a preferred embodiment of the present invention, the back coating layer includes a light-emitting side opening, wherein the light-emitting side opening accommodates at least a portion of the light-emitting side through hole from a top view perspective.

In a preferred embodiment of the present invention, the light-emitting side opening is aligns with the light-emitting side back surface opening of the light-emitting side through hole from a top view perspective.

In a preferred embodiment of the present invention, the back coating layer includes a light-receiving side opening, wherein the light-receiving side opening accommodates at least a portion of the light-receiving side through hole from a top view perspective.

In a preferred embodiment of the present invention, the light-receiving side opening aligns with the light-receiving side back surface opening of the light-receiving side through hole from a top view perspective.

In a preferred embodiment of the present invention, the optical semiconductor device includes a sealing resin comprising a portion filled in the recess of the substrate.

In a preferred embodiment of the present invention, the sealing resin includes a light-emitting side transparent resin disposed between the semiconductor light-emitting element and the light-emitting side transparent film.

In a preferred embodiment of the present invention, the light-emitting side transparent resin allows the main surface side of the semiconductor light-emitting element to expose.

In a preferred embodiment of the present invention, the sealing resin includes a light-receiving side transparent resin disposed between the semiconductor light-receiving element and the light-receiving side transparent film.

In a preferred embodiment of the present invention, the light-receiving side transparent resin allows the main surface side of the semiconductor light-receiving element to expose.

In a preferred embodiment of the present invention, the sealing resin includes a light-shielding resin disposed at the main surface side relatively to the light-emitting side transparent resin and the light-receiving side transparent resin.

In a preferred embodiment of the present invention, the light-shielding resin 62 is arranged with a space from the light-emitting side transparent resin and the light-receiving side transparent resin.

In a preferred embodiment of the present invention, the light-shielding resin is arranged with a space from the semiconductor light-emitting element and the semiconductor light-receiving element.

In a preferred embodiment of the present invention, the recess includes a middle surface of the recess. The middle surface of the recess connects the first side surface of the light-emitting side recess and the first side surface of the light-receiving side recess, and faces the same side as the main surface. The optical semiconductor device includes a control element supported on the middle surface of the recess, and the control element partitions the light-shielding resin, and the first side surface of the light-emitting side recess or the first side surface of the light-receiving side recess.

In a preferred embodiment of the present invention, the light-shielding resin 62 is in contact with the light-emitting side transparent resin and the light-receiving side transparent resin with each other.

In a preferred embodiment of the present invention, the conductive layer includes a conductive portion of main surface formed at the main surface.

In a preferred embodiment of the present invention, the optical semiconductor device includes a plurality of terminals. The plurality of terminals respectively includes columns being in contact with the conductive portion of main surface and passing through the light-shielding resin.

In a preferred embodiment of the present invention, an end surface of the column and an end surface of the light-shielding resin are coplanar with each other.

In a preferred embodiment of the present invention, the terminals include solder pads connecting with the columns and exposing from the light-shielding resin.

The Effect of the Present Invention

According to the present invention, the semiconductor light-emitting element and the semiconductor light-receiving element are disposed within the recess of the substrate. Hence, the semiconductor light-emitting element and the semiconductor light-receiving element are properly protected, and size of the whole optical semiconductor device is minimized. Further, since the light-emitting side transparent portion and the light-receiving side transparent portion are disposed at the substrate, which includes the semiconductor light-emitting element and the semiconductor light-receiving element disposed therein, the light from the semiconductor light-emitting element can be exactly emitted, and the light from outside to be detected can exactly reach the semiconductor light-receiving element. Hence, detection precision of the optical semiconductor device can be improved.

Other features and advantages of the present invention are illustrated in detail and concrete with reference to the accompanying figures.

DETAILED DESCRIPTION

Figure 1:
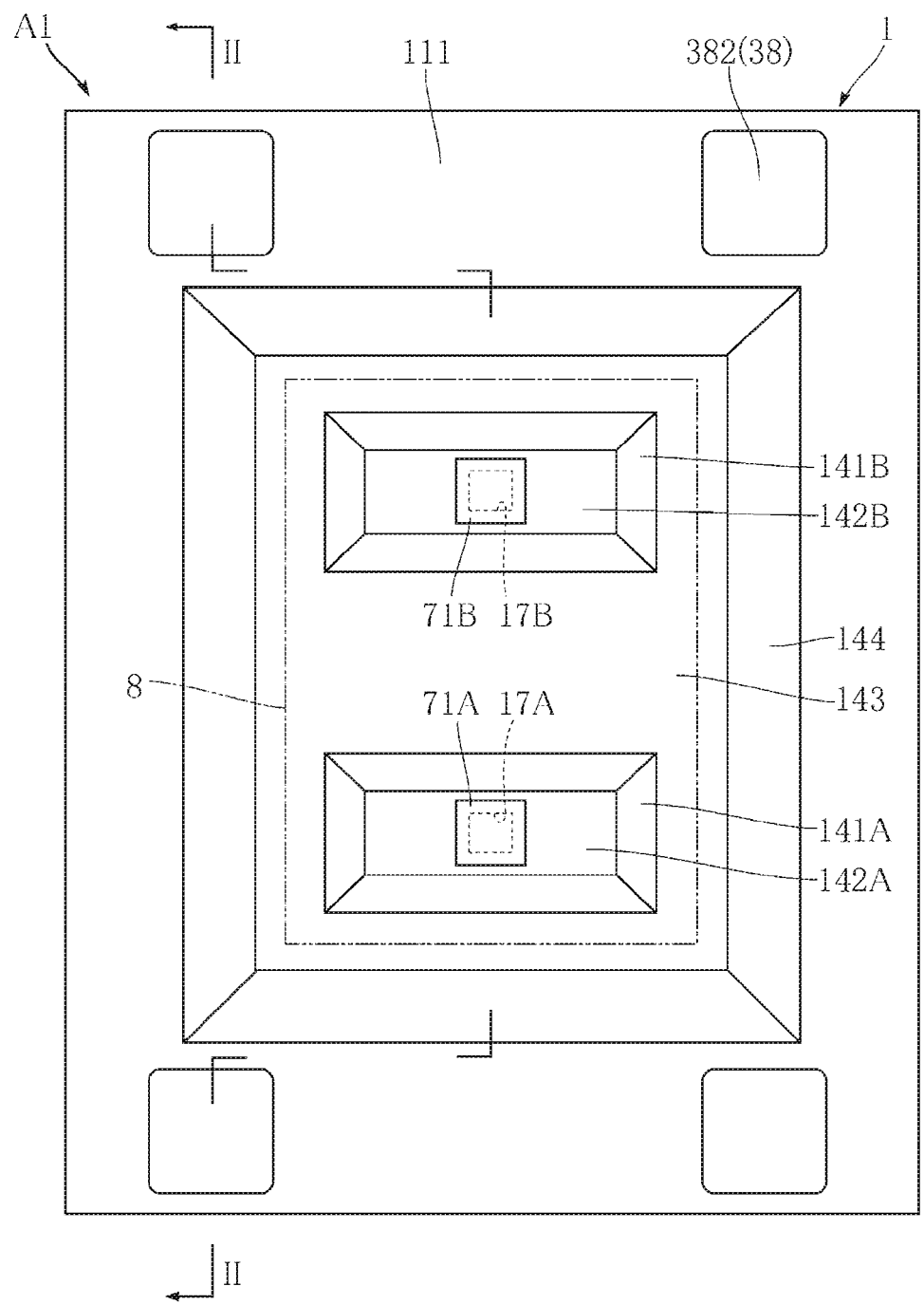
FIG. 1 is a plane view showing a main portion of an optical semiconductor device according to the first embodiment of the present invention.

The preferred embodiments of the present invention are specifically illustrated in the following descriptions with reference to the figures.

FIG. 1 to FIG. 4 show an optical semiconductor device according to the first embodiment of the present invention. An optical semiconductor device A1 of this embodiment includes a substrate 1, an insulating layer 2, a conductive layer 3, a light-shielding layer 4, a light-emitting side transparent film 5A, a light-receiving side transparent film 5B, a sealing resin 6, a semiconductor light-emitting element 7A, a semiconductor light-receiving element 7B and a control element 8, and is configured as a so-called reflective type photointerrupter.

Figure 2:
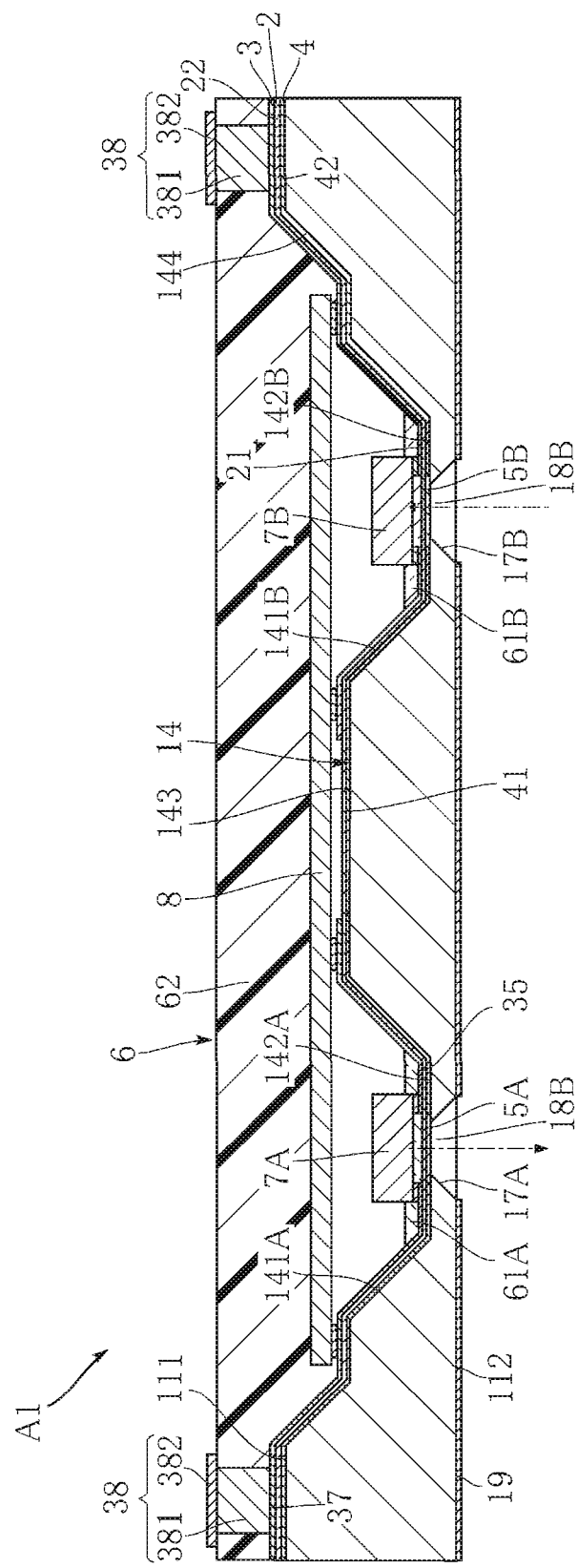
FIG. 2 is a cross-sectional view along the line II-II in FIG. 1.
Figure 3:
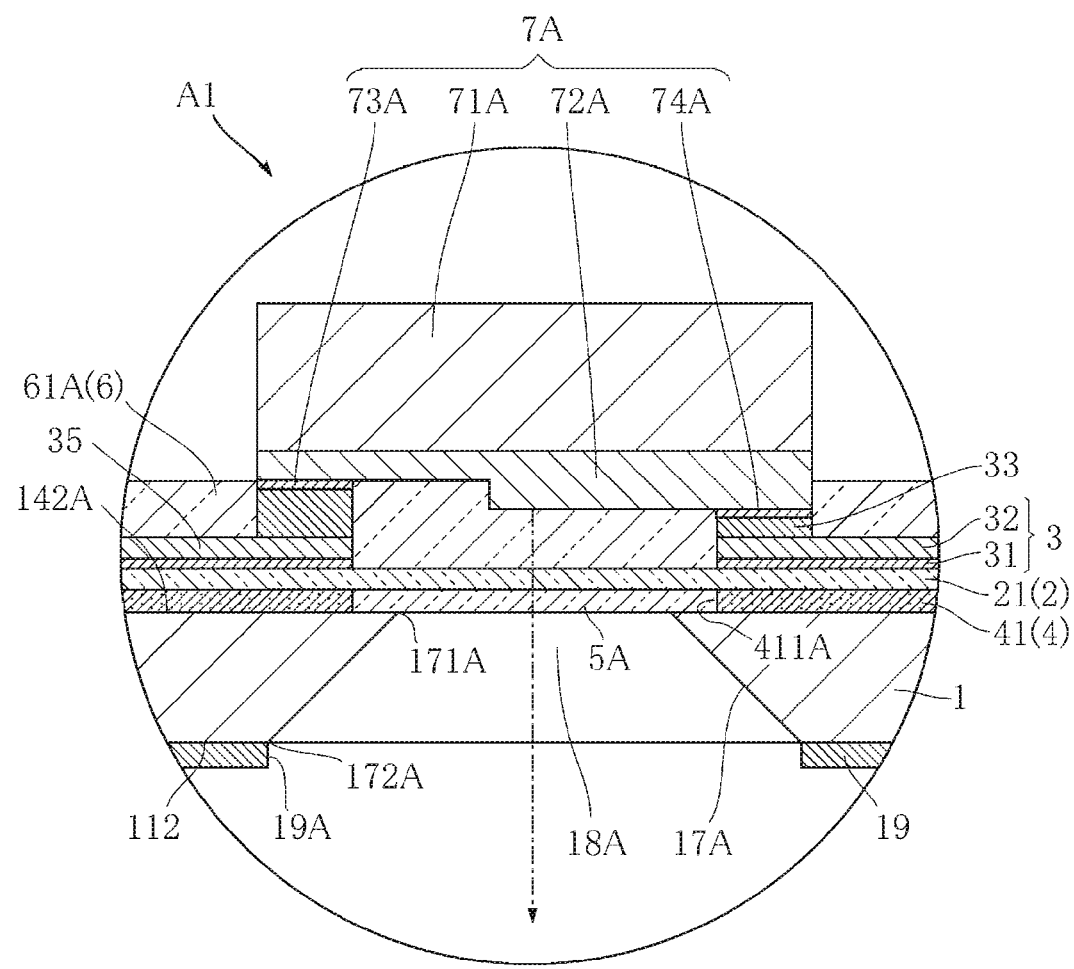
FIG. 3 is an enlarged cross-sectional view showing the main portion of the optical semiconductor device in FIG. 1.
Figure 4:
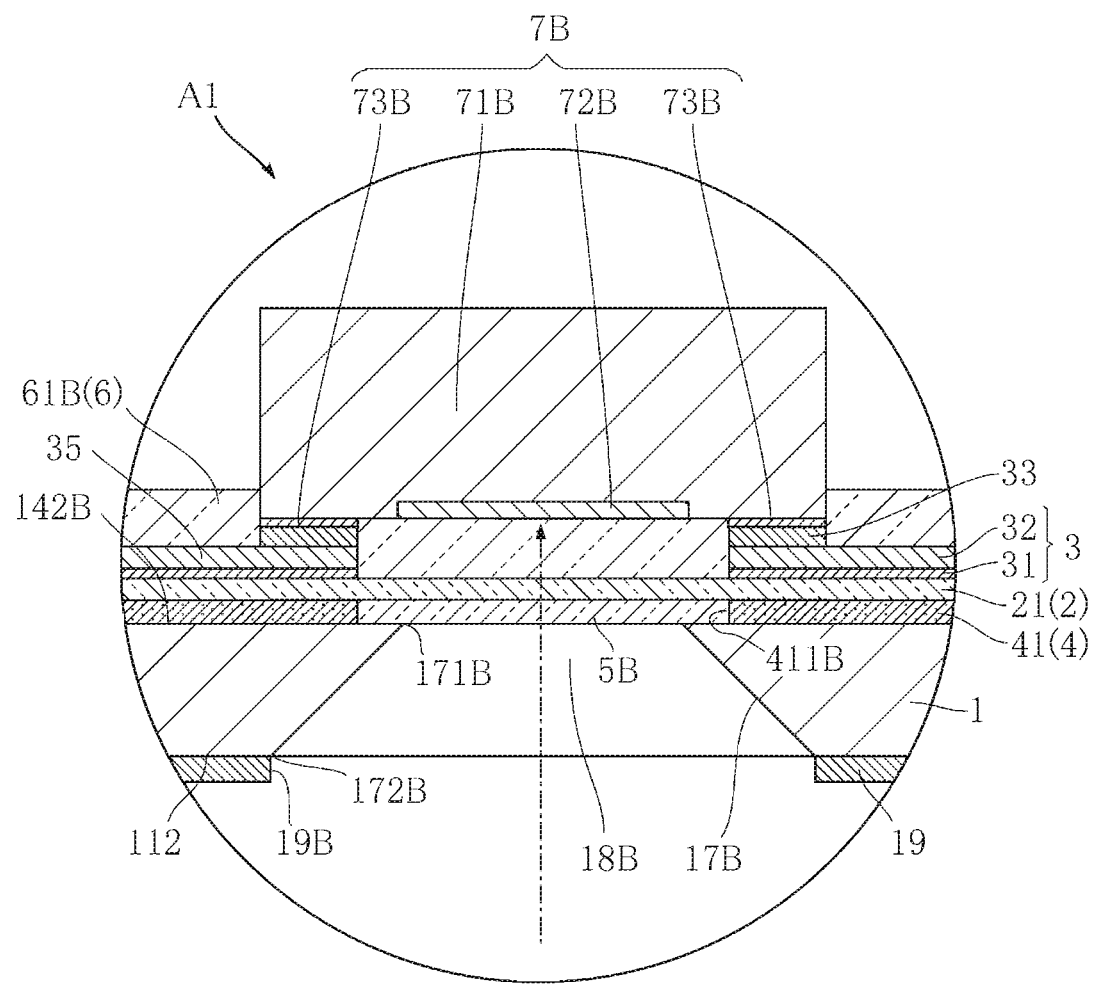
FIG. 4 is an enlarged cross-sectional view showing the main portion of the optical semiconductor device in FIG. 1.

FIG. 1 is a plane view showing a main portion of the optical semiconductor device A1. FIG. 2 is a cross-sectional view along the line II-II in FIG. 1. FIG. 3 is an enlarged cross-sectional view showing the main portion of the optical semiconductor device in FIG. 1. FIG. 4 is an enlarged cross-sectional view showing the main portion of the optical semiconductor device in FIG. 1. Further, in FIG. 1, for better understanding, the sealing resin 6 is omitted, and the control element 8 is indicated by the dotted line. Further, a view from a thickness direction of the substrate 1 is corresponding to a plane view indicated in the present invention.

The substrate 1 includes monocrystalline of the semiconductor material. In this embodiment, the substrate 1 includes Si monocrystalline. The material of the substrate 1 is not limited to Si, but can also be SiC, for example. The substrate 1 has a thickness of 300~2000 μm, for example. The semiconductor light-emitting element 7A, the semiconductor light-receiving element 7B and the control element 8 are disposed at the substrate 1.

The substrate 1 includes a main surface 111 and a back surface 112.

The main surface 111 faces a side in the thickness direction. The main surface 111 is flat. The main surface 111 is orthogonal to the thickness direction. The main surface 111 is a (100) surface or a (110) surface. In this embodiment, the main surface 111 is the (100) surface.

The back surface 112 faces the other side in the thickness direction. In other words, the back surface 112 faces oppositely to the main surface 111. The back surface 112 is flat. The back surface 112 is orthogonal to the thickness direction.

A recess 14, a light-emitting side through hole 17A and a light-receiving side through hole 17B is formed at the substrate 1.

The recess 14 is recessed from the main surface 111. The semiconductor light-emitting element 7A, the semiconductor light-receiving element 7B and the control element 8 are disposed at the recess 14. The depth of the recess 14 (the interval size between the main surface 111 and a following bottom surface 142A of the light-emitting side recess or a bottom surface 142B of the light-receiving side recess in the thickness direction) is 100~1800 μm, for example. The recess 14 is in a rectangular shape from the thickness direction view perspective. The shape of the recess 14 depends on using the (100) surface as the main surface 111.

The recess 14 has a first side surface 141A of the light-emitting side recess, a first side surface 141B of the light-receiving side recess, a bottom surface 142A of the light-emitting side recess, a bottom surface 142B of the light-receiving side recess, a middle surface 143 of the recess, and a second side surface 144 of the recess.

The bottom surface 142A of the light-emitting side recess faces the same side as the main surface 111 in the thickness direction of the substrate 1. The bottom surface 142A of the light-emitting side recess is in a rectangular shape from the thickness direction view perspective. The semiconductor light-emitting element 7A is disposed at the bottom surface 142A of the light-emitting side recess. The bottom surface 142A of the light-emitting side recess is a surface orthogonal to the thickness direction.

The bottom surface 142B of the light-receiving side recess faces the same side as the main surface 111 in the thickness direction of the substrate 1. The bottom surface 142B of the light-receiving side recess is in a rectangular shape from the thickness direction view perspective, The semiconductor light-receiving element 7B is disposed at the bottom surface 142B of the light-receiving recess. The bottom surface 142B of the light-receiving side recess is a surface orthogonal to the thickness direction. The bottom surface 142A of the light-emitting side recess is separated from the bottom surface 142B of the fight receiving side recess.

The first side surface 141A of the light-emitting side recess rises from the bottom surface 142A of the light-emitting side recess. The first side surface 141A of the fight-emitting side recess is connected to the bottom surface 142A of the light-emitting side recess. The first side surface 141A of the light-emitting side recess is inclined with respect to the thickness direction. The angle between the first side surface 141A of the light-emitting side recess and the plane, which is orthogonal to the thickness direction, is 55 degrees. The reason is that the (100) surface is used as the main surface 111. The first side surface 141A of the light-emitting side recess includes four flat planes.

The first side surface 141B of the fight-receiving side recess rises from the bottom surface 142B of the light-receiving side recess. The first side surface 141B of the light-receiving side recess is connected to the bottom surface 142B of the light-receiving side recess. The first side surface 141B of the light-receiving side recess is inclined with respect to the thickness direction. The angle between the first side surface 141B of the light-receiving side recess and the plane, which is orthogonal to the thickness direction, is 55 degrees. The reason is that the (100) surface is used as the main surface 111. The first side surface 141B of the light-receiving side recess includes four flat planes.

The middle surface 143 of the recess is connected to the first side surface 141A of the light-emitting side recess and the first side surface 141B of the light-receiving side recess. The middle surface 143 of the recess faces the same side as the main surface 111 in the thickness direction. The middle surface 143 of the recess is a flat surface, and as a whole is in a rectangular shape from the thickness direction view perspective.

The second side surface 144 of the recess rises from the middle surface 143 of the recess. The second side surface 144 of the recess is connected to the main surface 111. The second side surface 144 of the recess is inclined with respect to the thickness direction. The angle between the second side surface 144 of the recess and the plane, which is orthogonal to the thickness direction, is 55 degrees. The reason is that the (100) surface is used as the main surface 111. The second side surface 144 of the recess has four flat planes.

The light-emitting side through hole 17A penetrates a part of the substrate 1 from the bottom surface 142A of the light-emitting side recess to the back surface 112. The depth of the light-emitting side through hole 17A is 10~200 μm, for example. In this embodiment, the light-emitting side through hole 17A is in a rectangular shape from the thickness direction view perspective. Preferably, the light-emitting side through hole 17A is in a square shape from the thickness direction view perspective. Further, the light-emitting side through hole 17A has a light-emitting side main surface opening 171A and a light-emitting side back surface opening 172A. The light-emitting side main surface opening 171A is an opening disposed at the main surface 111 in the thickness direction of the substrate 1. The back surface opening 172A of the light-emitting side is an opening disposed at the back surface 112 in the thickness direction. From the thickness direction view perspective, the light-emitting side main surface opening 171A is smaller than the back surface opening 172A of the light-emitting side, and accommodated in the back surface opening 172A of the light-emitting side. Accordingly, a cross-sectional area of the light-emitting side through hole 17A is in a tapered shape and size of the area is decreasing from the back surface 112 toward the main surface 111. The angle between the inner surface of light-emitting side through hole 17A and the plane orthogonal to the thickness direction is 55 degrees. The reason is that the (100) surface is used as the main surface 111.

The light-receiving side through hole 17B penetrates a part of the substrate 1 from the bottom surface 142B of the light-receiving side recess to the back surface 112. The depth of the light-receiving side through hole 17B is 10~200 μm, for example. In this embodiment, the light-receiving side through hole 17B is in a rectangular shape from the thickness direction view perspective. Preferably, the light-receiving side through hole 17B is in a square shape from the thickness direction view perspective. Further, the light-receiving side through hole 17B has a light-receiving side main surface opening 171B and a light-receiving side back surface opening 172B. The light-receiving side main surface opening 171B is an opening disposed at the main surface 111 in the thickness direction of the substrate 1. The back surface opening 172B of the light-receiving side is an opening disposed at the back surface 112 in the thickness direction. From the thickness direction view perspective, the light-receiving side main surface opening 171B is smaller than the back surface opening 172B of the light-receiving side, and accommodated in the back surface opening 172B of the light-receiving side. Accordingly, a cross-sectional area of the light-receiving side through hole 17B is in a tapered shape and size of the area is decreasing from the back surface 112 toward the main surface 111. The angle between the inner surface of light-receiving side through hole 17B and the plane orthogonal to the thickness direction is 55 degrees. The reason is that the (100) surface is used as the main surface 111.

A back coating layer 19 is formed on the back surface 112. In this embodiment, the whole back surface 112 is covered by the back coating layer 19. The back coating layer 19 includes SiN, for example. The back coating layer 19 includes a light-emitting side opening 19A and a light-receiving side opening 19B. From the thickness direction view perspective, at least a portion of the light-emitting side through hole 17A is accommodated in the light-emitting side opening 19A. In this embodiment, the light-emitting side opening 19A aligns with the back surface opening 172A of the light-emitting side of the light-emitting side through hole 17A from the thickness direction view perspective. From the thickness direction view perspective, at least a portion of the light-receiving side through hole 17B is accommodated in the light-receiving side opening 19B. In this embodiment, the light-receiving side opening 19B aligns with the back surface opening 172B of the light-receiving side of the light-receiving side through hole 17B from the thickness direction view perspective.

The light-shielding layer 4 is disposed between the substrate 1 and at least a portion of the insulating layer 2, and the light-shielding layer 4 shields light from the semiconductor light-emitting element 7A and light to be received by the semiconductor light-receiving element 7B. In this embodiment, the light-shielding layer 4 is directly formed on the substrate 1. In this embodiment, the light-shielding layer 4 includes a compound of metal and semiconductor constituting the substrate 1, more specifically, a compound of Ti and Si. Further, the light-shielding layer 4 can also be a layer including a metal such as Ti.

The light-shielding layer 4 includes a light-shielding portion 41 of an recess inner surface, and a light-shielding portion 42 of the main surface. The light-shielding portion 41 of the recess inner surface is a portion of the light-shielding layer 4 formed within the recess 14 of the substrate 1. The light-shielding portion 42 of the main surface is a portion of the light-shielding layer 4 formed on the main surface 111.

The light-shielding portion 41 of the recess inner surface includes a light-emitting side opening 411A and a light-receiving side opening 411B.

The light from the semiconductor light-emitting element 7A passes through the light-emitting side opening 411A. The light-emitting side opening 411A accommodates the light-emitting side main surface opening 171A of the light-emitting side through hole 17A from the thickness direction view perspective. Further, an inner end of the light-emitting side opening 411A is disposed in the position outer than an inner end of the light-emitting side main surface opening 171A from the thickness direction view perspective. From the thickness direction view perspective, the light-emitting side opening 411A is in a rectangular shape, for example.

The light toward the semiconductor light-receiving element 7B passes through the light-receiving side opening 411B. The light-receiving side opening 411B accommodates the light-receiving side main surface opening 171B of the light-receiving side through hole 17B from the thickness direction view perspective. Further, an inner end of the light-receiving side opening 411B is disposed in the position outer than an inner end of the light-receiving side main surface opening 171B from the thickness direction view perspective. From the thickness direction view perspective, the light-receiving side opening 411B is in a rectangular shape, for example.

From the thickness direction view perspective, the light-emitting side opening 411A of the light-shielding layer 4 accommodates the light-emitting side transparent film 5A. Further, from the thickness direction view perspective, the light-emitting side transparent film 5A accommodates the light-emitting side main surface opening 171A of the light-emitting side through hole 17A. The light-emitting side transparent film 5A includes the material for the light from the semiconductor light-emitting element 7A to pass through, and includes $SiO_2$ in this embodiment. The end portion of the light-emitting side transparent film 5A is in contact with the bottom surface 142A of the light-emitting side recess. The central portion of the light-emitting side transparent film 5A blocks the light-emitting side through hole 17A. In this embodiment, the outer edge of the light-emitting side transparent film 5A and the inner edge of the light-emitting side opening 411A of the light-shielding layer 4 align with each other.

In this embodiment, the light-emitting side transparent film 5A and the light-emitting side through hole 17A constitute a light-emitting side transparent portion 18A. The light-emitting side transparent portion 18A allows light from the semiconductor light-emitting element 7A to pass through the bottom surface 142A of the light-emitting side recess to the back surface 112.

From the thickness direction view perspective, the light-receiving side opening 411B of the light-shielding layer 4 accommodates the light-receiving side transparent film 5B. Further, from the thickness direction view perspective, the light-receiving side transparent film 5B accommodates the light-emitting side main surface opening 171A of the light-receiving side through hole 17B. The light-receiving side transparent film 5B includes the material for the light toward the semiconductor light-receiving element 7B to pass through, and includes $SiO_2$ in this embodiment. The end portion of the light-receiving side transparent film 5B is in contact with the bottom surface 142B of the light-receiving side recess. The central portion of the light-receiving side transparent film 5B blocks the light-receiving side through hole 17B, in this embodiment, the outer edge of the light-receiving side transparent film 5B and the inner edge of the light-receiving side opening 411B of the light-shielding layer 4 align with each other.

In this embodiment, the light-receiving side transparent film 5B and the light-receiving side through hole 17B constitute a light-receiving side transparent portion 18B. The light-receiving side transparent portion 18B allows light from the back surface 112 to pass through the bottom surface 142B of the light-receiving side recess to the semiconductor light-receiving element 7B.

The insulating layer 2 is disposed between the conductive layer 3 and the substrate 1. In this embodiment, the insulating layer 2 is between the conductive layer 3 and the light-shielding layer 4, or between the conductive layer 3 and the light-emitting side transparent film 5A, or between the conductive layer 3 and the light-receiving side transparent film 5B. The thickness of the insulating layer 2 is about 0.1~1.0 µm, for example. The insulating layer 2 includes $SiO_2$ or SiN, for example.

The insulating layer 2 includes an insulating portion 21 of the recess inner surface and an insulating portion 22 of the main surface.

The insulating portion 21 of the recess inner surface is formed at the recess 14 of the substrate 1. In this embodiment, the insulating portion 21 of the recess inner surface is formed all over the first side surface 141A of the light-emitting side recess, the first side surface 141B of the light-receiving side recess, the bottom surface 142A of the light-emitting side recess, the bottom surface 142B of the light-receiving side recess, the middle surface 143 of the recess and the second side surface 144 of the recess. The insulating portion 21 of the recess inner surface is formed by chemical vapor deposition (CVD) or sputtering, for example. The insulating portion 21 of the recess inner surface includes $SiO_2$, for example.

The insulating portion 22 of the main surface is formed at the main surface 111. The insulating portion 22 of the main surface is formed by CVD or sputtering. The insulating portion 22 of the main surface includes $SiO_2$, for example. in this embodiment, the whole main surface 111 (the light-shielding portion 42 of the main surface of the light-shielding layer 4) is covered by the insulating portion 22 of the main surface.

The conductive layer 3 conducts the semiconductor light-emitting element 7A, the semiconductor light-receiving element 7B and the control element 8. The conductive layer 3 is used for constituting current paths for inputting current to or outputting current from the semiconductor light-emitting element 7A, the semiconductor light-receiving element 7B and the control element 8.

The conductive layer 3 includes a seed layer 31 and a plating layer 32.

The seed layer 31 is a base layer for forming a desired plating layer 32. The seed layer 31 is disposed between the insulating layer 2 and the plating layer 32. The seed layer 31 includes Cu, for example. The seed layer 31 is formed by sputtering, for example. The thickness of the seed layer 31 is not more than 1 µm, for example.

The plating layer 32 is formed by electroplating the seed layer 31. The plating layer 32 includes a laminated layer having Cu or having Ti, Ni and Cu, for example. The thickness of the plating layer 32 is about 3~10 µm, for example. The thickness of the plating layer 32 is more than the thickness of the seed layer 31.

The conductive layer 3 includes a conductive portion 35 of the recess bottom surface and a conductive portion 36 of the main surface.

The conductive portion 35 of the recess bottom surface is a portion formed at the recess 14 (the insulating portion 21 of the insulating layer 2 on the recess inner surface), and formed at proper positions on the first side surface 141A of the light-emitting side recess, the first side surface 141B of the light-receiving side recess, the bottom surface 142A of the light-emitting side recess, the bottom surface 142B of the light-receiving side recess, the middle surface 143 of the recess, and the second side surface 144 of the recess. The conductive portion 35 of the recess bottom surface includes portions functioning as soldering pads for arranging the semiconductor light-emitting element 7A, the semiconductor light-receiving element 7B and the control element 8; and portions functioning as wirings, etc.

The conductive portion 36 of the main surface is a portion formed at the main surface 111 (the insulating portion 22 of the insulating layer 2 on the main surface). The conductive portion 36 of the main surface conducts the conductive portion 35 of the recess bottom surface.

The semiconductor light-emitting element 7A is carried on the bottom surface 142A of the light-emitting side recess. In this embodiment, the semiconductor light-emitting element 7A includes a support substrate 71A, a semiconductor layer 72A, an n side electrode 73A and a p side electrode 74A. The semiconductor light-emitting element 7A is configured to form a flip-chip type LED (Light Emitting Diode) chip to be installed without wirings.

The support substrate 71A is a basic member of the semiconductor light-emitting element 7A. The semiconductor layer 72A includes some semiconductor layers laminated on the support substrate 71A. The semiconductor layer 72A includes an active layer, for example. In the situation that the semiconductor layer 72A includes GaAs-based semiconductor, for example, the semiconductor light-emitting element 7A emits infrared light. The light-emitting side transparent film 5A (the light-emitting side transparent portion 18A) is disposed on the front side of the semiconductor layer 72A. The n side electrode 73A is an electrode conducting the n-type semiconductor layer of the semiconductor layer 72A. The p side electrode 74A is an electrode conducting the p-type semiconductor layer of the semiconductor layer 72A. The n side electrode 73A and the p side electrode 74A include Au or Al, for example. The n side electrode 73A and the p side electrode 74A are bonded to a proper position at the conductive portion 35 of the conductive layer 3 on the recess bottom surface through a bonding layer 33. The bonding layer 33 includes an alloy having Sn, for example. As the alloy, specifically, a lead-free solder such as Sn—Sb based alloy or a Sn—Ag bases alloy can be used.

The semiconductor light-emitting element 7B is carried on the bottom surface 142B of the light-receiving side recess. In this embodiment, the semiconductor light-receiving element 7B includes a main body 71B, a light-receiving portion 72B, and an n side electrode 73A. The semiconductor light-receiving element 7B is configured to form a flip-chip type phototransistor or photodiode to be installed without wirings.

The main body 71B is a basic member of the semiconductor light-receiving element 7B. The light-receiving portion 72B is a portion receives light to be converted to charges by the photoelectric conversion function. The light-receiving side transparent film 5B (the light-receiving side transparent portion 18B) is disposed on the front side of the light-receiving portion 72B. The electrode 73B is an electrode conducting the light-receiving portion 72B. The electrode 73B includes Au or Al, for example. The electrode 73B is bonded to a proper position at the conductive portion 35 of the conductive layer 3 on the recess bottom surface through the bonding layer 33. The bonding layer 33 includes an alloy having Sn, for example. As the alloy, specifically, a lead-free solder such as Sn—Sb based alloy or a Sn—Ag bases alloy can be used.

The control element 8 is carried on the middle surface 143 of the recess and is an element for performing light-emitting control of the semiconductor light-emitting element 7A or light-receiving control of the semiconductor light-receiving element 7B. In addition to an integrated circuit element such as ASIC (Application Specific Integrated Circuit), the control element 8, can also be a passive element such as a chip resistor, an inductor, or a capacitor for passively controlling current, wherein the current is input to or output from the semiconductor light-emitting element 7A and the semiconductor light-receiving element 7B.

The scaling resin 6 includes a part filling in the recess 14 for sealing at least a portion of the recess 14. The sealing resin 6 includes a light-emitting side transparent resin 61A, a light-receiving side transparent resin 61B and a light-shielding resin 62.

The light-emitting side transparent resin 61A is between the semiconductor light-emitting element 7A and the light-emitting side transparent film 5A. The light-emitting side transparent resin 61A allows a main surface 111 side portion of the semiconductor light-emitting element 7A to expose. The light-emitting side transparent resin 61A includes transparent epoxy resin or silicone resin, for example.

The light-receiving side transparent resin 61B is between the semiconductor light-receiving element 7B and the light-receiving side transparent film 5B. The light-receiving side transparent resin 61B allows a main surface 111 side portion of the semiconductor light-receiving element 7B to expose. The light-receiving side transparent resin 61B includes transparent epoxy resin or silicone resin, for example.

The light-shielding resin 62 is disposed on the main surface 11 side with respect to the light-emitting side transparent resin 61A and the light-receiving side transparent resin 61B. In this embodiment, the light-shielding resin 62 is arranged with a space from the light-emitting side transparent resin 61A and the light-receiving side transparent resin 61B. In this embodiment, the control element 8 partitions the light-shielding resin 62 and the space. The light-shielding resin 62 includes a portion covers the main surface 111. As the material of the light-shielding resin 62, epoxy resin, phenol resin, polyimide resin, polybenzoxazole (PBO) resin and silicone resin can be used, for example.

Further, the optical semiconductor device A1 includes some terminals 38. Terminals are used for installing the optical semiconductor device A1 on a circuit board. The terminal 38 includes a column 381 and a pad 382.

The column 381 is in contact with the main surface conductive portion 36 of the conductive layer 3, and passes through the light-shielding resin 62 in the thickness direction. The column 381 includes Cu, for example. The end surface of the column 381 in the upper portion of the figure and the end surface of the light-shielding resin 62 are coplanar with each other.

The pad 382 is connected to the column 381 by covering the end surface of the column 381, and exposed from the light-shielding resin 62. The pad 382 includes a Ni layer, a Pb layer and an Au layer laminated with each other, for example.

Then, with regard to an example of a method for manufacturing the optical semiconductor device A1, refer to FIGS. 5 to 20 and the following descriptions for illustration.

Figure 5:
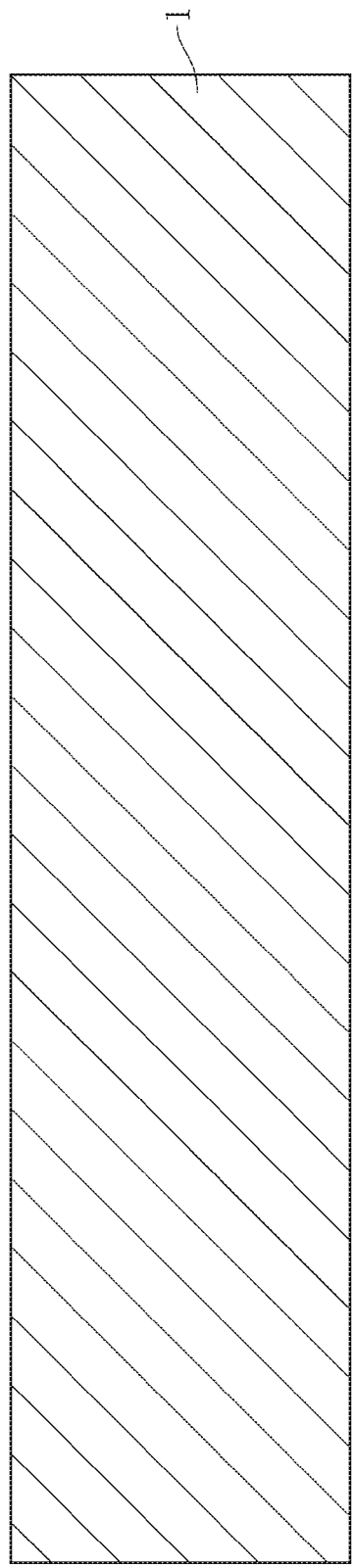
FIG. 5 is a cross-sectional view showing a step of the method for manufacturing the optical semiconductor device in FIG. 1.

First, a substrate 1 is prepared as shown in FIG. 5. The substrate 1 includes monocrystalline of semiconductor material. In this embodiment, the he substrate 1 includes Si monocrystalline. The thickness of the substrate 1 is about 200~2500 μm, for example. In the following descriptions, steps for manufacturing one optical semiconductor device A1 are illustrated as an example. However, a larger semiconductor substrate can be prepared for manufacturing some optical semiconductor devices A1 collectively. Further, the substrate 1 shown in FIG. 5 and subsequent figures is different from the substrate 1 of the optical semiconductor device A1, strictly speaking, but for better understanding, any substrate is presented as the substrate 1.

The substrate 1 includes a main surface 111 facing oppositely to a back surface 112. In this embodiment, the plane having crystal orientation (100), i.e. the (100) plane, is used as the main surface 111.

Subsequently, a mask layer including $SiO_2$ is formed by oxidizing the main surface 111, for example. The thickness of the mask layer is about 0.7~1.0 μm, for example.

Then, the mask layer is patterned by etching, for example. As a result, an opening with a rectangular shape, for example, is formed on the mask layer. The shape and the size of the opening are set according to the shape and the size of the finally desired recess 14.

Subsequently, anisotropy etching is performed to the substrate 1 by using KOH, for example. KOH is an example of alkaline etching solution capable of well performing anisotropy etching on Si monocrystalline. As a result, a recess is formed in the substrate 1. The recess includes a bottom surface and a side surface. The bottom surface forms a right angle with the thickness direction. The angle between the side surface and the plane orthogonal to the thickness direction is about 55 degrees.

Figure 6:
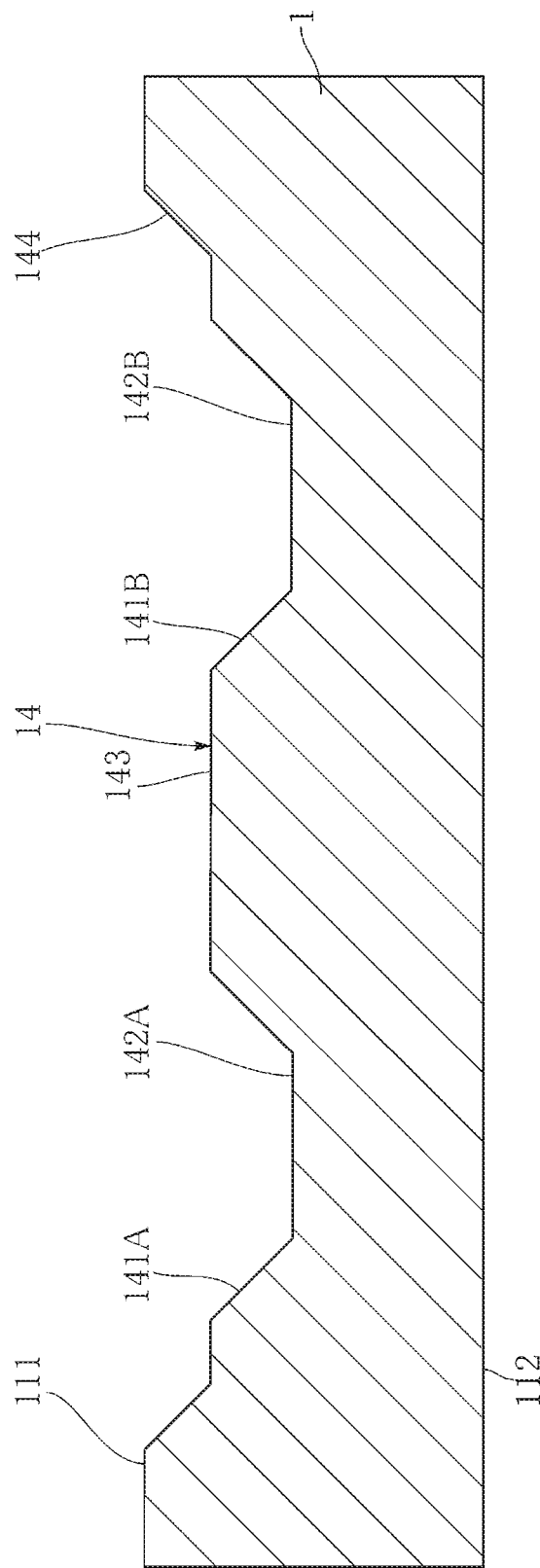
FIG. 6 is a cross-sectional view showing a step of the method for manufacturing the optical semiconductor device in FIG. 1.

Subsequently, the opening of the mask layer is expanded. Then, anisotropy etching is performed by using KOH. Then, the mask layer is removed. The recess 14 shown in FIG. 6 is formed by the two-step etching. The recess 14 includes a first side surface 141A of a light-emitting side recess, a first side surface 141B of a light-receiving side recess, a bottom surface 142A of the light-emitting side recess, a middle surface 143 of the recess and a second side surface 144 of the recess, and is recessed from the main surface 111. The recess 14 is in a rectangular shape from the thickness direction view perspective.

Figure 7:
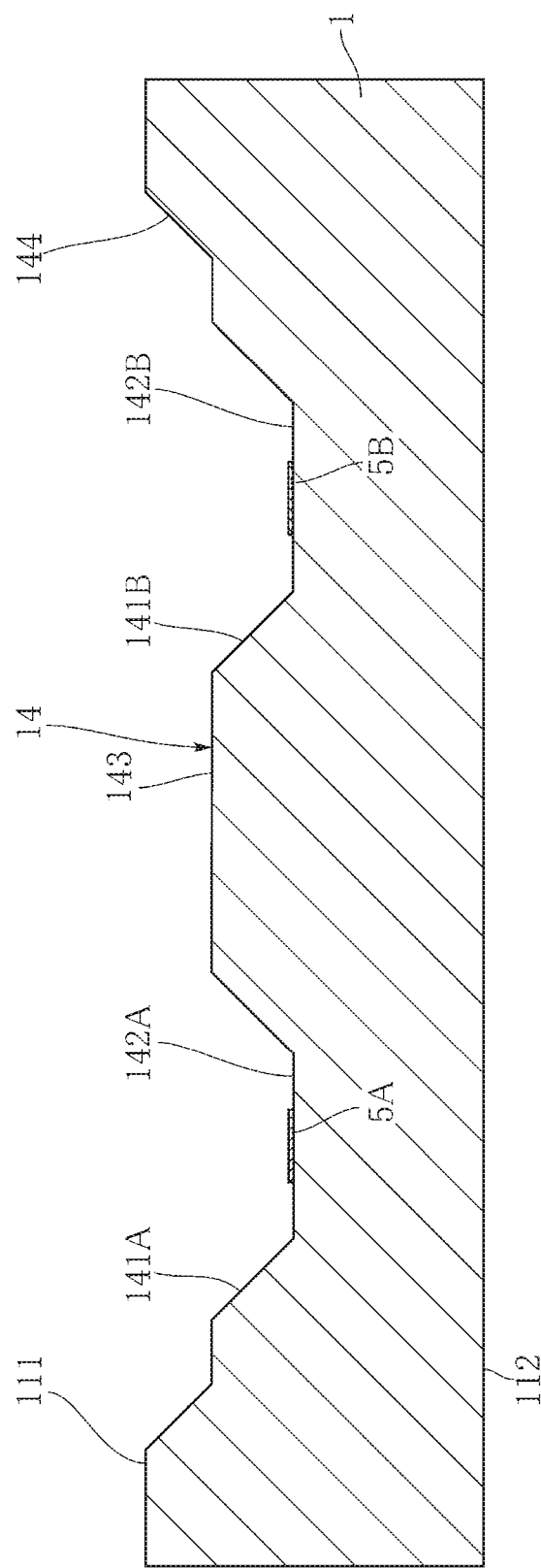
FIG. 7 is a cross-sectional view showing a step of the method for manufacturing the optical semiconductor device in FIG. 1.

Subsequently, as shown in FIG. 7, a light-emitting transparent film 5A and a light-receiving side transparent film 5B are formed. The light-emitting transparent film 5A and the light-receiving side transparent film 5B are formed by the following method: Using the mask layer to form a $SiO_2$ film on the bottom surface 142A of the light-emitting side recess and the bottom surface 142B of the light-receiving side recess by CVD.

Figure 8:
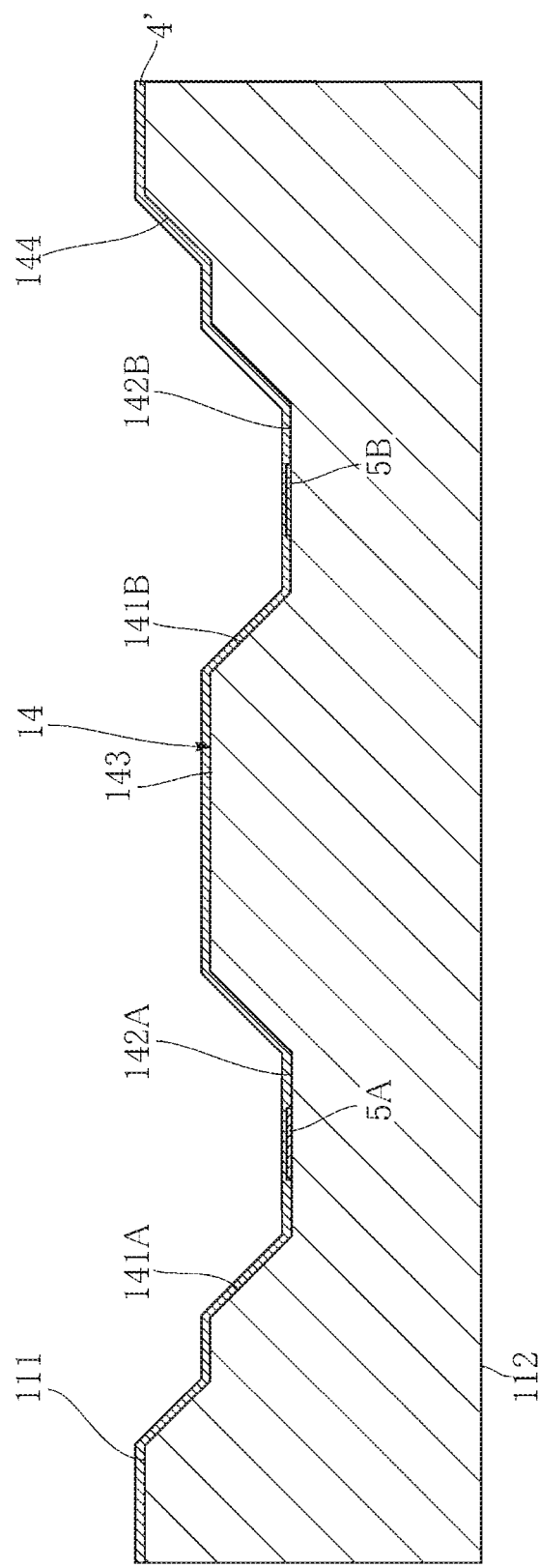
FIG. 8 is a cross-sectional view showing a step of the method for manufacturing the optical semiconductor device in FIG. 1.
Figure 9:
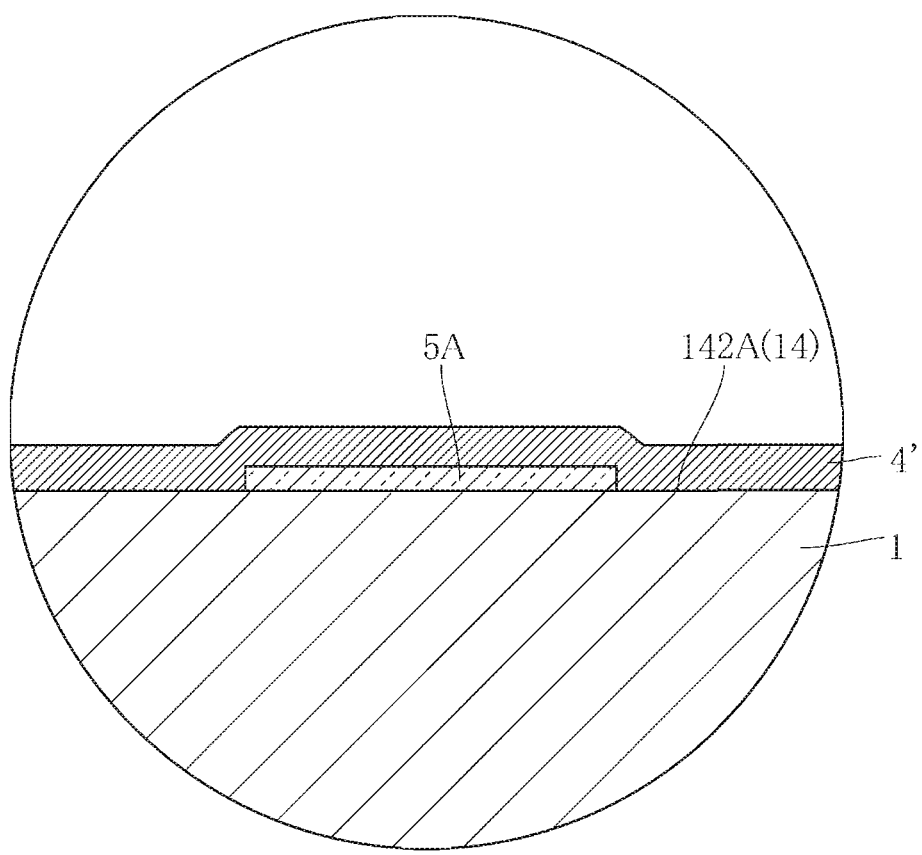
FIG. 9 is an enlarged cross-sectional view showing a step of the method for manufacturing the optical semiconductor device in FIG. 1.
Figure 10:
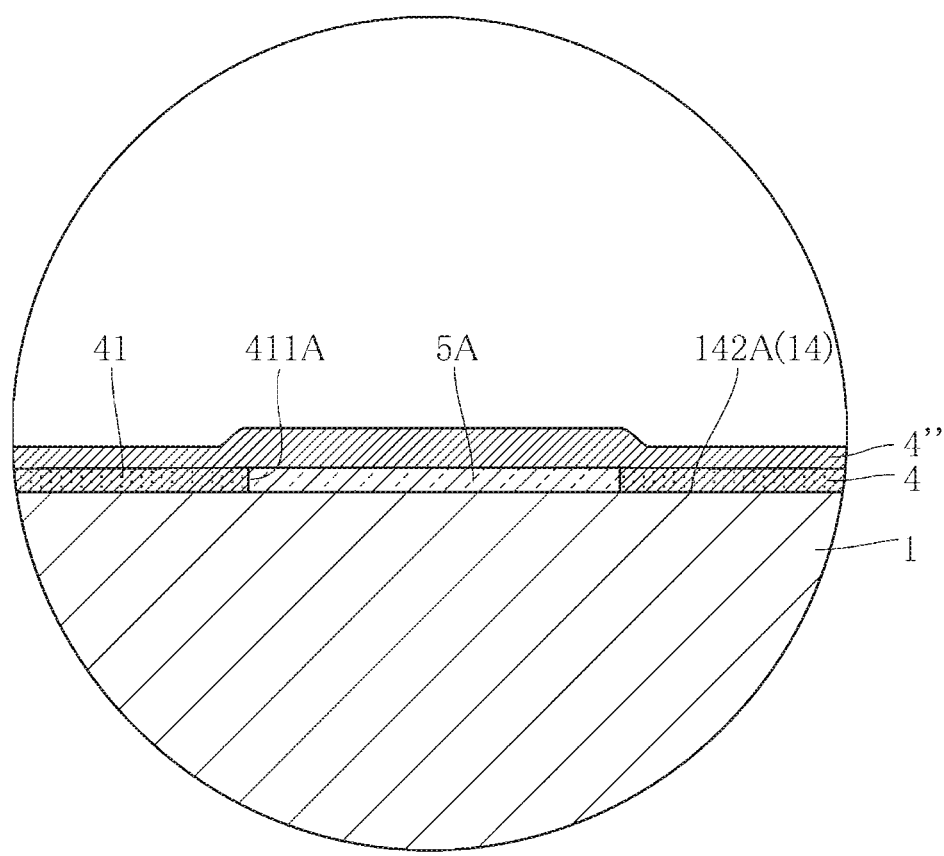
FIG. 10 is an enlarged cross-sectional view showing a step of the method for manufacturing the optical semiconductor device in FIG. 1.

Subsequently, as shown in FIG. 8 and FIG. 9, a Ti layer 4' is formed. The Ti layer 4' is formed by sputtering, for example to form a layer including Ti. The Ti layer 4' is formed to cover the recess 14, the main surface 111, the light-emitting side transparent film 5A and the light-receiving side transparent film 5B.

Then, a thermal treatment is performed on the substrate formed with the Ti layer 4'. By the thermal treatment, a portion at the substrate 1 side in the thickness direction of the Ti layer 4' chemically combines with the substrate 1, and a light-shielding layer 4 including compounds of Ti and Si is formed. Further, the thermal treatment does not cause a chemical reaction between the Ti layer 4' and the light-emitting side transparent film 5A including $SiO_2$, or between the Ti layer 4' and the light-receiving side transparent film 5B including $SiO_2$. Therefore, a light-emitting side opening 411A and a light receiving side opening 411B are formed in the light-shielding layer 4. The inner edge of the light-emitting side opening 411A aligns with the outer edge of the light-emitting side transparent film 5A, and the inner edge of the light receiving side opening 411B aligns with the outer edge of the light-receiving side transparent film 5B. Further, the Ti, which is not reacted with Si, is remained as a Ti layer 4".

Figure 11:
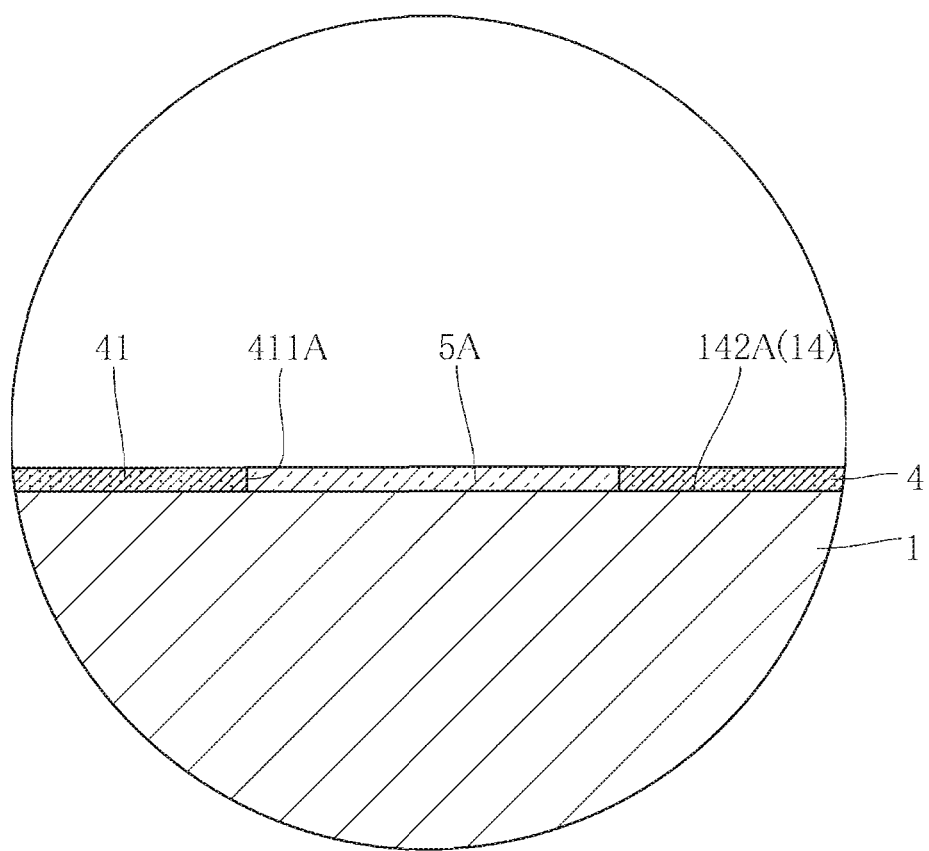
FIG. 11 is an enlarged cross-sectional view showing a step of the method for manufacturing the optical semiconductor device in FIG. 1.
Figure 12:
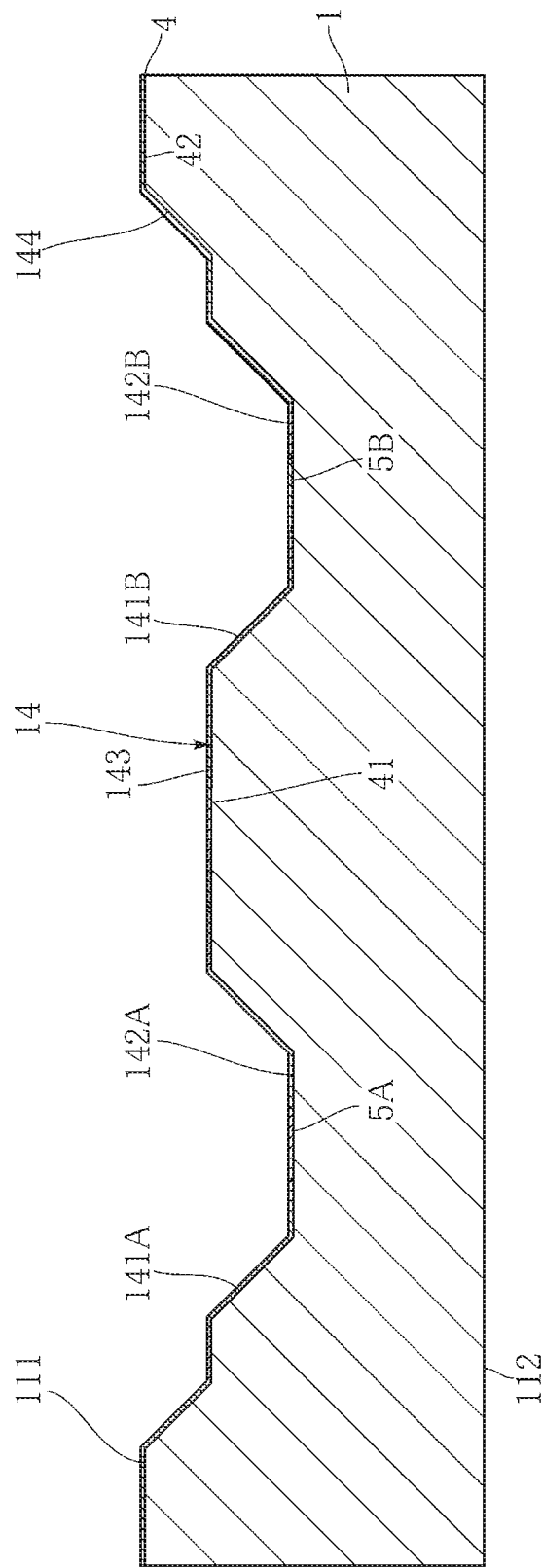
FIG. 12 is a cross-sectional view showing a step of the method for manufacturing the optical semiconductor device in FIG. 1.

Subsequently, the Ti layer 4" is removed by etching. As a result as shown in FIG. 11 and FIG. 12, the light-shielding layer 4, the light-emitting side transparent film 5A and the light-receiving side transparent film 5B are exposed. The light-shielding layer 4 includes a light-shielding portion 41 of the recess inner surface and a light-shielding portion 42 of the main surface.

Figure 13:
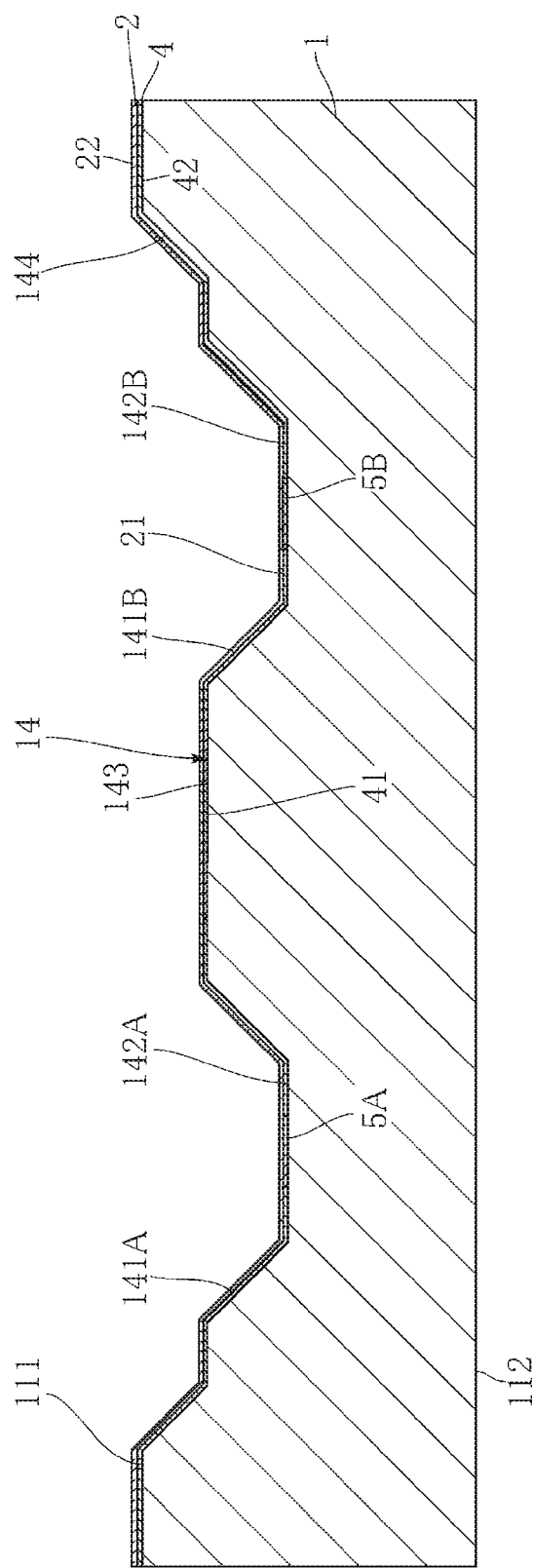
FIG. 13 is a cross-sectional view showing a step of the method for manufacturing the optical semiconductor device in FIG. 1.

Subsequently, as shown in FIG. 13, an insulating layer 2 is formed on the main surface 111 and the recess 14 by CVD or sputtering. The insulating layer 2 becomes an insulating portion 21 of the recess inner surface and an insulating portion 22 of the main surface.

Figure 14:
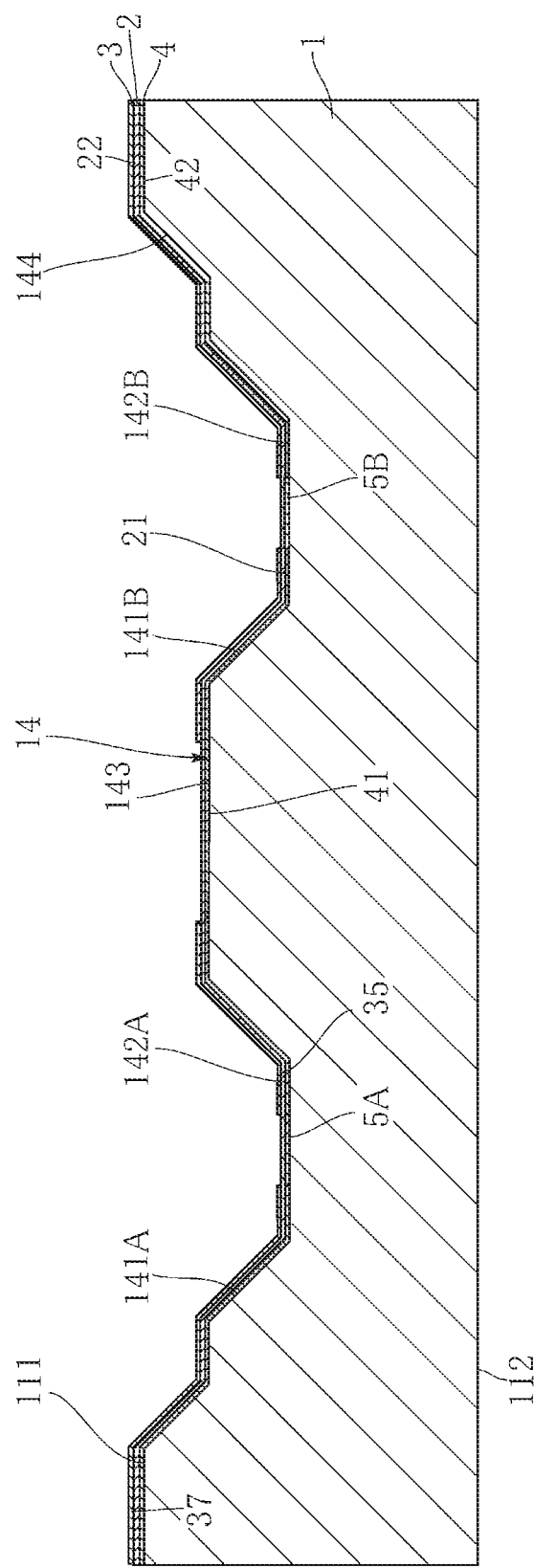
FIG. 14 is a cross-sectional view showing a step of the method for manufacturing the optical semiconductor device in FIG. 1.

Subsequently, as shown in FIG. 14, a conductive layer 3 including a seed layer 31 and a plating layer 32 is formed. The seed layer 31 is formed by sputtering using Cu and then performing patterning, for example. The plating layer 32 is formed by electroplating the seed layer 31, for example. As a result, the plating layer 32 including the laminated layers of Cu or Ti, Ni and Cu can be obtained. The conductive layer 3 is formed by laminating the seed layer 31 and the plating layer 32. The conductive layer 3 includes a conductive portion 35 of the recess bottom surface and a conductive portion 36 of the main surface.

Figure 15:
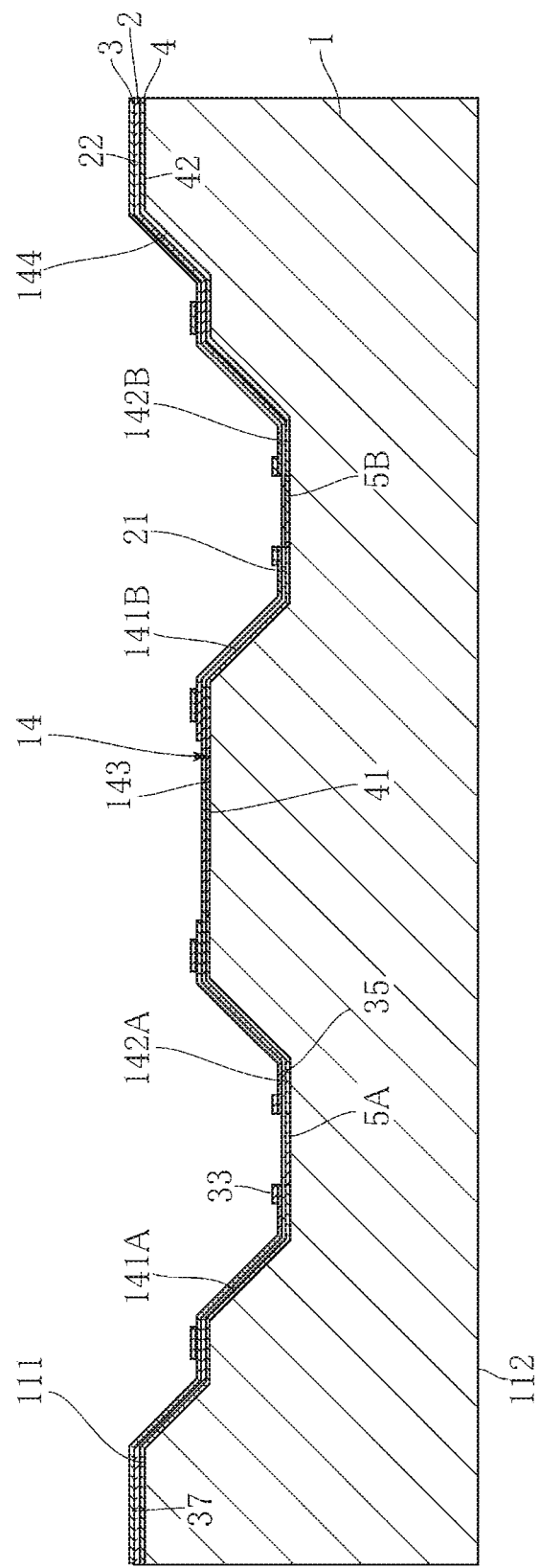
FIG. 15 is a cross-sectional view showing a step of the method for manufacturing the optical semiconductor device in FIG. 1.

Then, as shown in FIG. 15, a bonding layer 33 is formed on a proper position on the conductive portion 35 of the conductive layer 3 on the recess bottom surface. The bonding layer 33 is formed by plating an alloy having Sn, for example. As the alloy, specifically, a lead-free solder such as Sn—Sb based alloy or a Sn—Ag bases alloy can be used.

Figure 16:
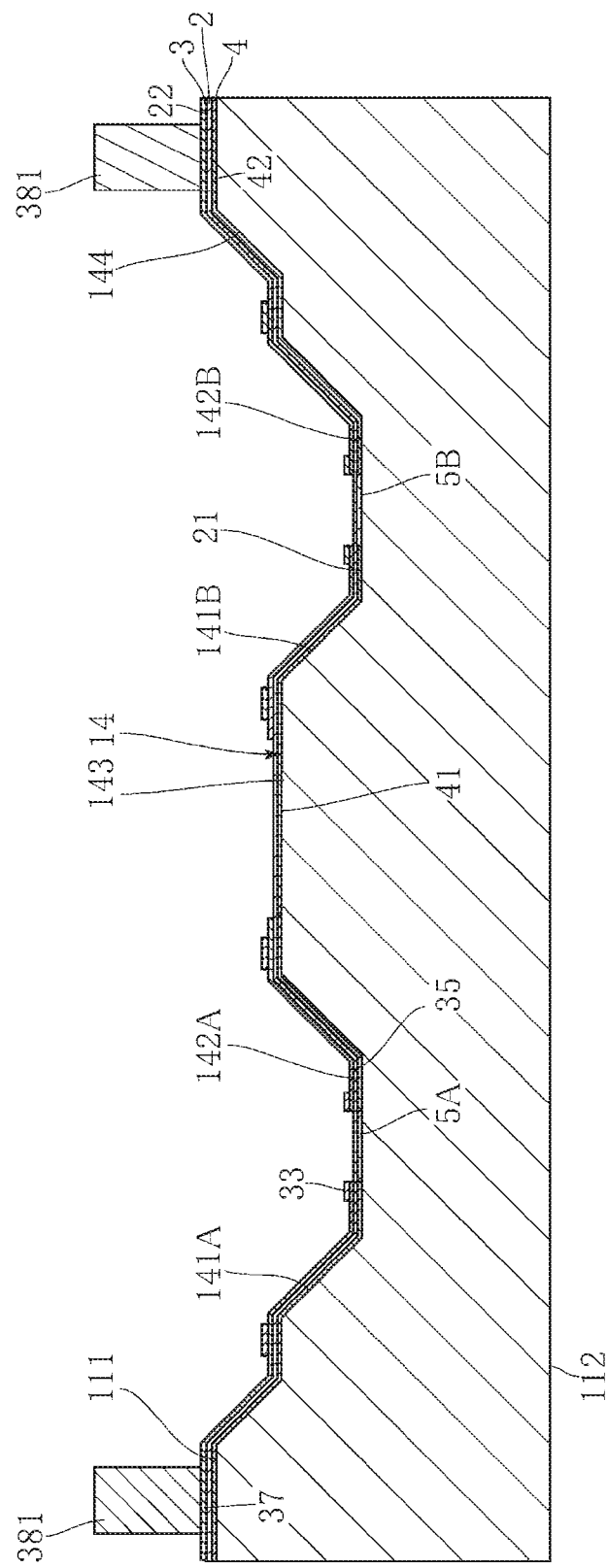
FIG. 16 is a cross-sectional view showing a step of the method for manufacturing the optical semiconductor device in FIG. 1.

Subsequently, as shown in FIG. 16, some columns 381 are formed. Columns 381 are formed by the following method, for example. A shielding layer covering the main surface 111 or the recess 14 is formed, and a Cu layer is laminated on an opening portion of the mask layer by plating. The mask layer is removed by etching.

Figure 17:
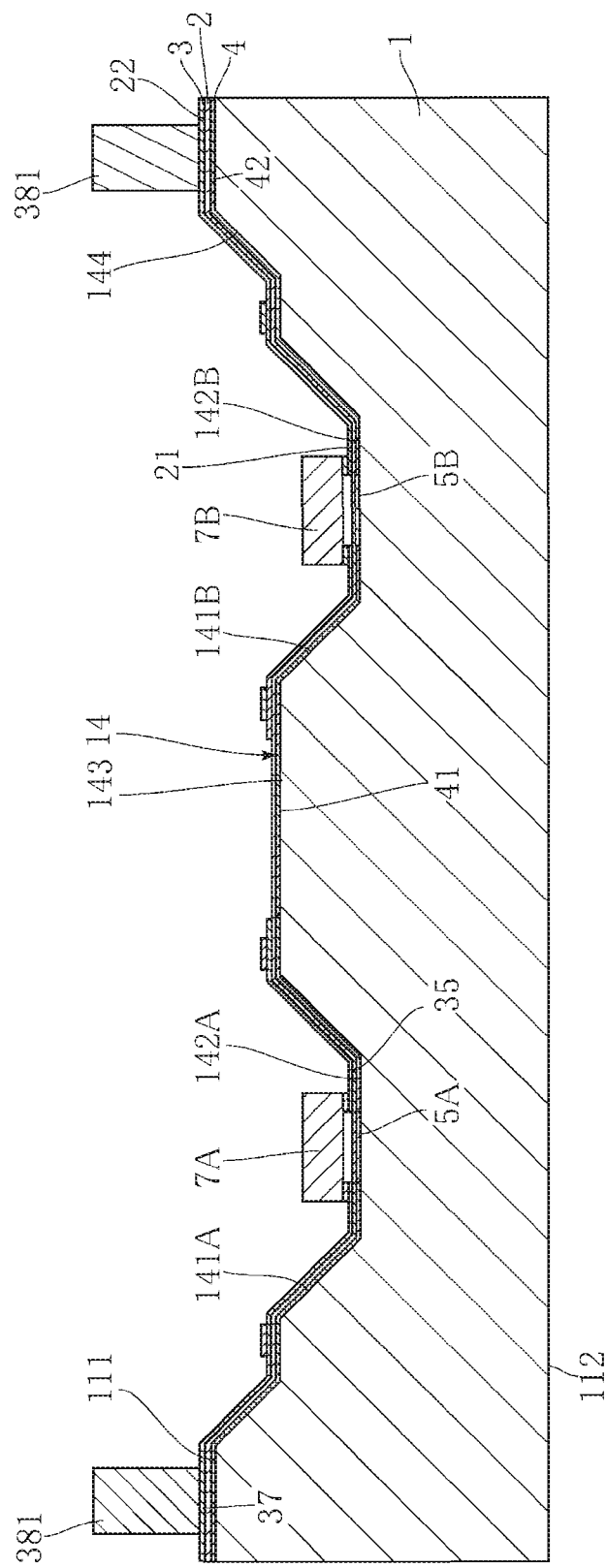
FIG. 17 is a cross-sectional view showing a step of the method for manufacturing the optical semiconductor device in FIG. 1.

Subsequently, as shown in FIG. 17, the semiconductor light-emitting element 7A and the semiconductor light-receiving element 7B are arranged on the recess 14. More specifically, the semiconductor light-emitting element 7A is carried on the bottom surface 142A of the light-emitting side recess, and the semiconductor light-receiving element 7B is carried on the bottom surface 142B of the light-receiving side recess. Then, the bonding layer 33 is melted by a reflow oven and then cured, such that the arrangement of the semiconductor light-emitting element 7A and the semiconductor light-receiving element 7B is completed.

Figure 18:
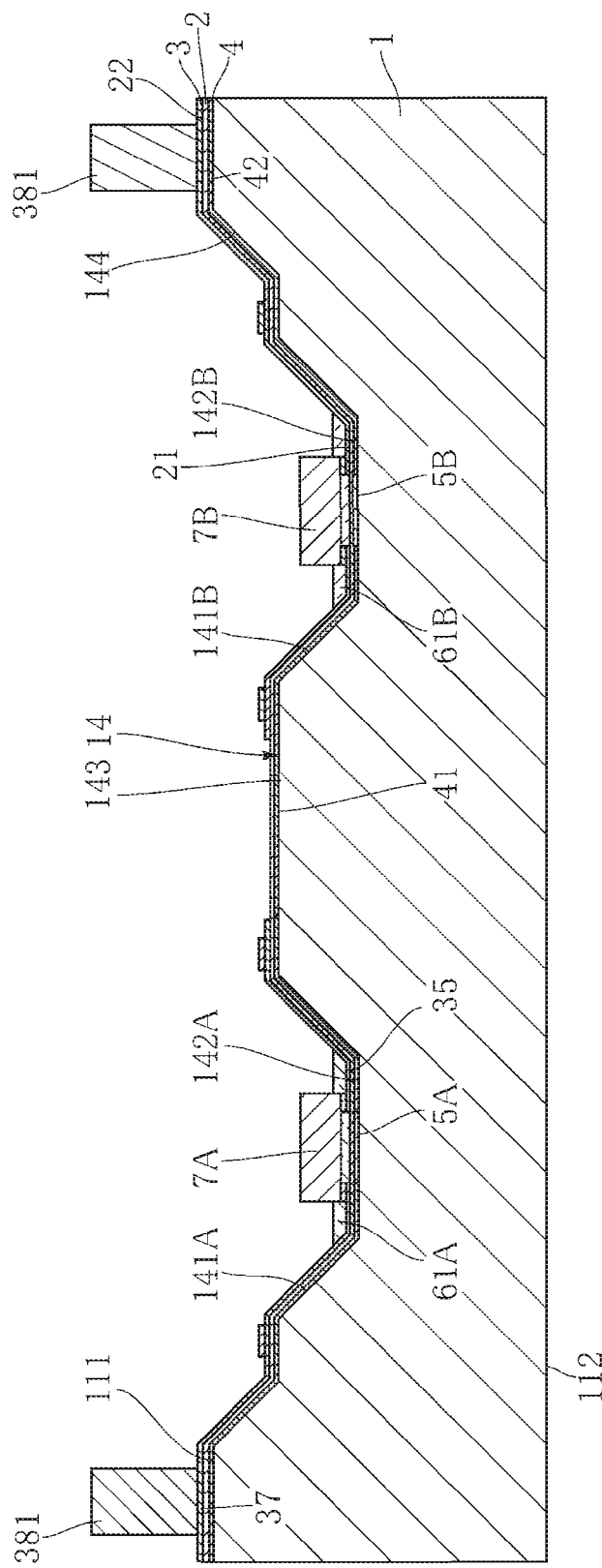
FIG. 18 is a cross-sectional view showing a step of the method for manufacturing the optical semiconductor device in FIG. 1.

Subsequently, as shown in FIG. 18, a light-emitting side transparent resin 61A and a light-receiving side transparent resin 61B are formed. The light-emitting side transparent resin 61A and the light-receiving side transparent resin 61B are formed by the following method, for example. The transparent liquid resin material is in a space between the light-emitting side transparent film 5A and the bottom surface 142A of the light-emitting side recess, and a space between the light-receiving side transparent film 5B and the bottom surface 142B of the light-receiving side recess, and the liquid resin material is cured.

Figure 19:
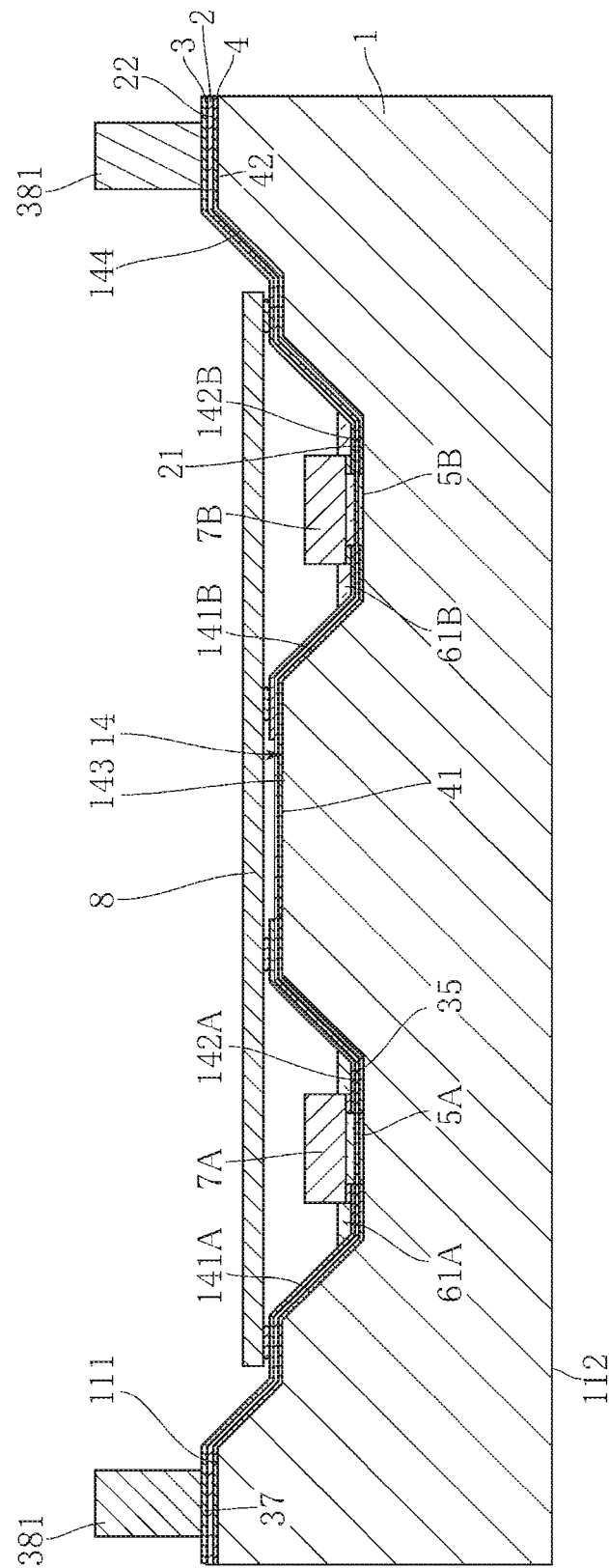
FIG. 19 is a cross-sectional view showing a step of the method for manufacturing the optical semiconductor device in FIG. 1.
Figure 20:
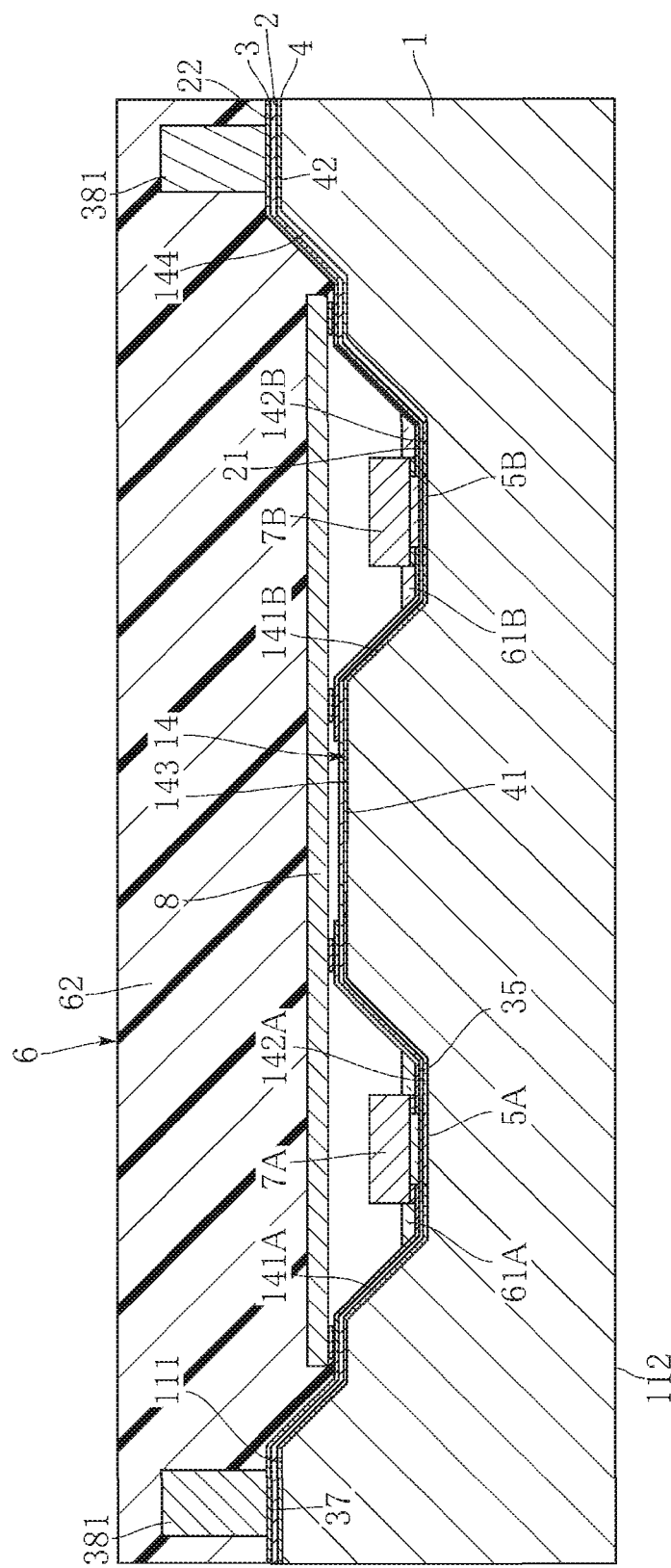
FIG. 20 is a cross-sectional view showing a step of the method for manufacturing the optical semiconductor device in FIG. 1.

Subsequently, as shown in FIG. 19, a control element 8 is arranged. More specifically, the control element 8 is carried on the middle surface 143 of the recess. Then, the bonding layer 33 is melted by the reflow oven and then cured, such that the arrangement of the control element 8 is completed.

Subsequently, a light-shielding resin 62 is formed. The light-shielding resin 62 is formed by the following method, for example. The main surface 111, the control element 8 and columns 381 are covered by black resin material, and the black resin material is cured. However, the region, which is closer to the lower portion in the figure than the control element 8, is not filled by the resin material. Therefore, a space positioned under the control element 8 in the figure is ensured. Further, the step is preferably performed under vacuum or in the environment under low pressure.

Figure 21:
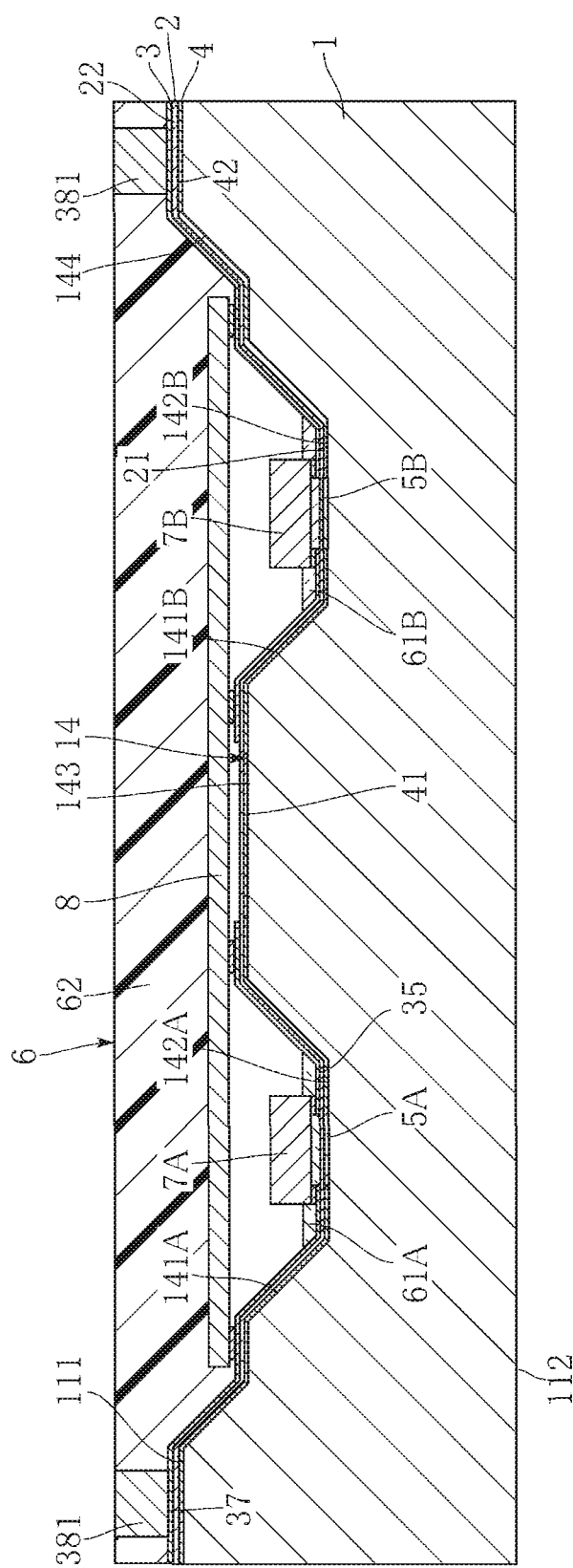
FIG. 21 is a cross-sectional view showing a step of the method for manufacturing the optical semiconductor device in FIG. 1.

Subsequently, the light-shielding resin 62 and columns 381 are ground collectively. Therefore, as shown in FIG. 21, the end surface of the column 381 and the end surface (surface) of the light-shielding resin 62 become coplanar with each other.

Figure 22:
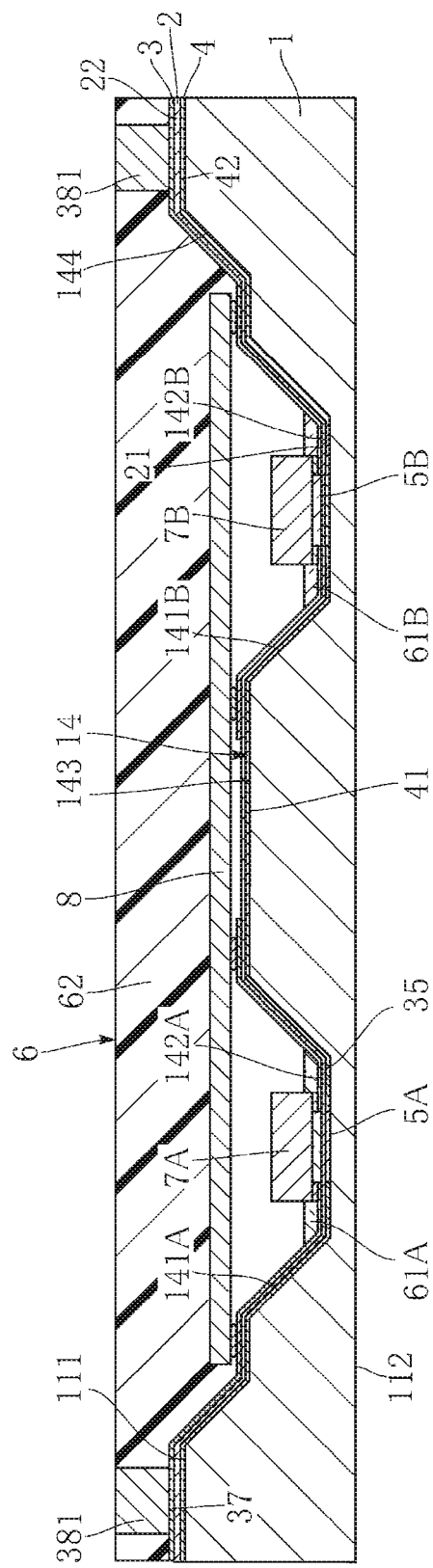
FIG. 22 is a cross-sectional view showing a step of the method for manufacturing the optical semiconductor device in FIG. 1.
Figure 23:
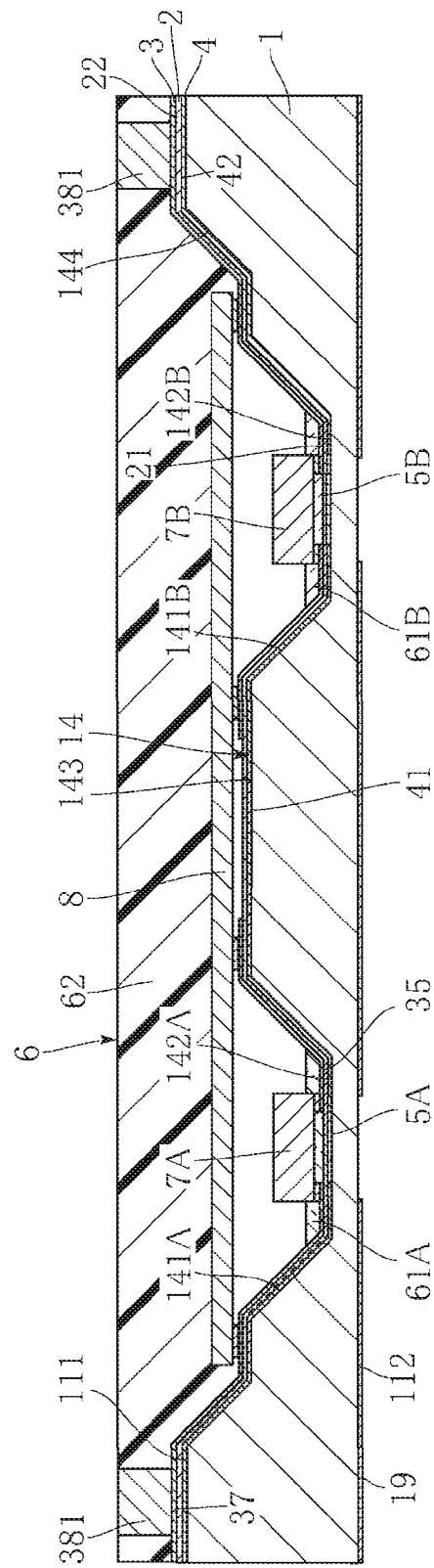
FIG. 23 is a cross-sectional view showing a step of the method for manufacturing the optical semiconductor device in FIG. 1.

Subsequently, as shown in FIG. 22, the substrate 1 is ground from the back surface 112 side, Then, as shown in FIG. 23, a back coating layer 19 is formed on the back surface 112. The back coating layer 19 is formed by forming a SiN layer covering the back surface 112 by CVD or sputtering. Further, a light-emitting side opening 19A and a light-receiving side opening 19B are formed on the back coating layer 19 by etching.

Figure 24:
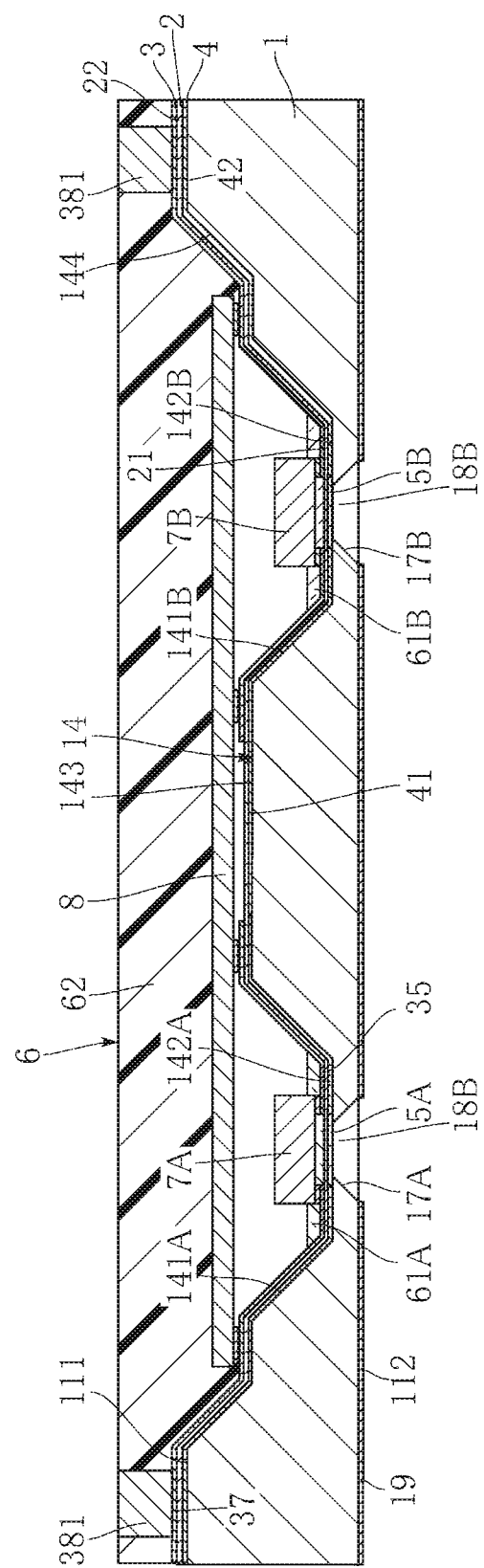
FIG. 24 is a cross-sectional view showing a step of the method for manufacturing the optical semiconductor device in FIG. 1.

Subsequently, the back coating layer 19 is used as a mask layer, and anisotropic etching using KOH is performed on the back surface, for example. The etching is performed until reaching the light-emitting side transparent film 5A and the light-receiving side transparent film 5B. Therefore, as shown in FIG. 24, a light-emitting side through hole 17A and a light-receiving side through hole 17B are formed. Then, for example, the pads 382 are formed by electroless plating, then some terminals 38 are obtained. The optical semiconductor device A1 is completed by the above steps.

Then, the functions of the optical semiconductor device A1 are illustrated.

According to this embodiment, the semiconductor light-emitting element 7A and the semiconductor light-receiving element 7B are disposed in the recess 14 of the substrate 1. Hence, the semiconductor light-emitting element 7A and the semiconductor light-receiving element 7B can be properly protected, and size of the whole optical semiconductor device A1 is minimized. Further, the light-emitting side transparent portion 18A and the light-receiving transparent portion 18B are disposed at the substrate 1 having the semiconductor light-emitting element 7A and the semiconductor light-receiving element 7B disposed therein, such that the light from the semiconductor light-emitting element 7A is exactly emitted, and the light from outside to be detected can exactly reach the semiconductor light-receiving element 7B. Therefore, the detection precision of the optical semiconductor device A1 can be enhanced.

The light-emitting side transparent portion 18A and the light-receiving side transparent portion 18B respectively include a light-emitting side through hole 17A and a light-receiving side through hole 17B. The light-emitting side through hole 17A and the light-receiving side through hole 17B are space for light to more easily pass through. Therefore, detection precision of the optical semiconductor device A1 can be enhanced.

The light-shielding layer 4 exactly shields infrared light from the semiconductor light-emitting element 7A, for example. The light-shielding layer 4 covers the recess 14 and the main surface 111 except the light-emitting side opening 411A and the light-receiving side opening 411B. Accordingly, undesired external light can be prevented from reaching the semiconductor light-receiving element 7B. Further, the light from the semiconductor light-emitting element 7A can be prevented from emitting to an undesired direction. Thus, the light from the semiconductor light-emitting element 7A can be prevented from passing through the interior of the substrate 1 to reach the semiconductor light-receiving element 7B. The above situations are beneficial to increase the detection precision of the optical semiconductor device A1.

The light-emitting side transparent film 5A and the light-receiving side transparent film 5B are disposed on the front surface of the semiconductor light-emitting element 7A and the semiconductor light-receiving element 7B. The light-emitting side transparent film 5A and the light-receiving side transparent film 5B are not covered by the light-shielding layer 4. Hence, the light from the semiconductor light-emitting element 7A or the light emitting toward the semiconductor light-receiving element 7B can properly pass.

The light-shielding layer 4 including compound of Ti and Si is suitable for shielding the infrared light, which is the representative of light. Further, referring to FIG. 9 to FIG. 11, according to the steps for forming the light-shielding layer 4 including compound of Ti and Si, the inner edge of the light-emitting side opening 411A of the light-shielding layer 4 aligns with the outer edge of the light-emitting side transparent film 5A, and the inner edge of the light-receiving side opening 411B aligns with the outer edge of the light-receiving side transparent film SB. The above situations are beneficial to prevent undesired gaps between the light-receiving side transparent film 5A and the light-emitting side opening 411A and between the light-receiving side transparent film 5B and the light-receiving side opening 411B (the light-shielding layer 4). Alternatively, the light-emitting side transparent film 5A and the light-receiving side transparent film 5B can be prevented from being improperly blocked by the light-shielding layer 4. For increasing the detection precision of the optical semiconductor device A1, the above situations are preferred.

From the thickness direction view perspective, the light-emitting side main surface opening 171A of the light-emitting side through hole 17A is accommodated in the light-emitting side transparent film 5A. Further, from the thickness direction view perspective, the light-receiving side main surface opening 171B of the light-receiving side through hole 17B is accommodated in the light-receiving side transparent film 5B. Accordingly, the detection precision of the optical semiconductor device A1 can also be increased.

FIG. 25 to FIG. 30 show another embodiment of the present invention. Further, in these figures, elements the same as or similar to those in the above embodiment are denoted by the same reference numerals as the above embodiment.

Figure 25:
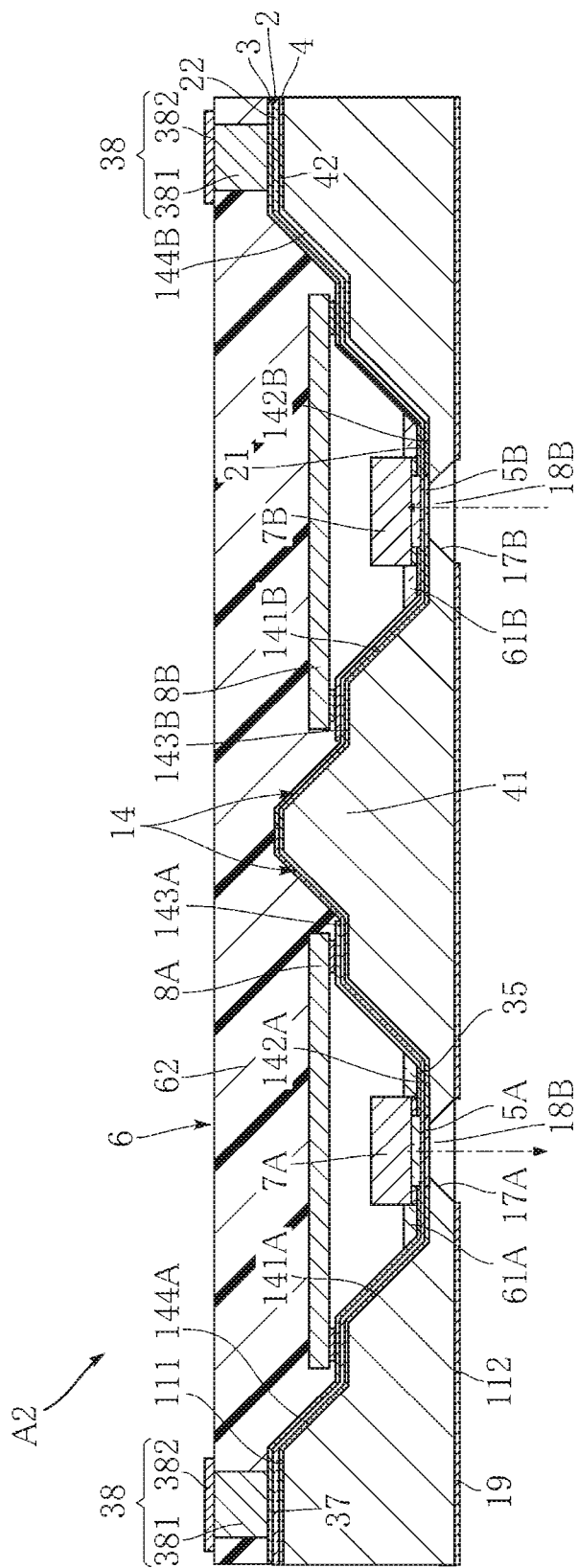
FIG. 25 is a cross-sectional view showing an optical semiconductor device according to the second embodiment of the present invention.

FIG. 25 shows an optical semiconductor device according to the second embodiment of the present invention. An optical semiconductor device A2 of this embodiment includes two recesses 14 formed on a substrate 1. A semiconductor light-emitting element 7A is disposed in one recess 14, and a semiconductor light-receiving element 7B is disposed in the other recess 14. The recess 14 having the semiconductor light-emitting element 7A disposed therein includes a first side surface 141A of a light-emitting side recess, a bottom surface 142A of the light-emitting side, a middle surface 143A of the light-emitting side, and a second side surface 144A of the light-emitting side recess. The recess 14 having the semiconductor light-receiving element 7B disposed therein includes a first side surface 141B of a light-receiving side recess, a bottom surface 142B of the light-receiving side, a middle surface 143B of the light-receiving side, and a second side surface 144B of the light-receiving side recess.

Further, the optical semiconductor device A2 includes a control element SA and a control element 8B. The control element 8A performs the light-emitting control of the semiconductor light-emitting element 7A. The control element 8B performs the light-receiving control of the semiconductor light-receiving element 7B. The semiconductor light-emitting element 7A is carried on the middle surface 143A of the light-emitting side on the recess 14. The semiconductor light-receiving element 7B is carried on the middle surface 143B of the light-receiving side on the recess 14.

According to this embodiment, the minimization and the increase of detection precision of the optical semiconductor device A2 can be achieved.

Figure 26:
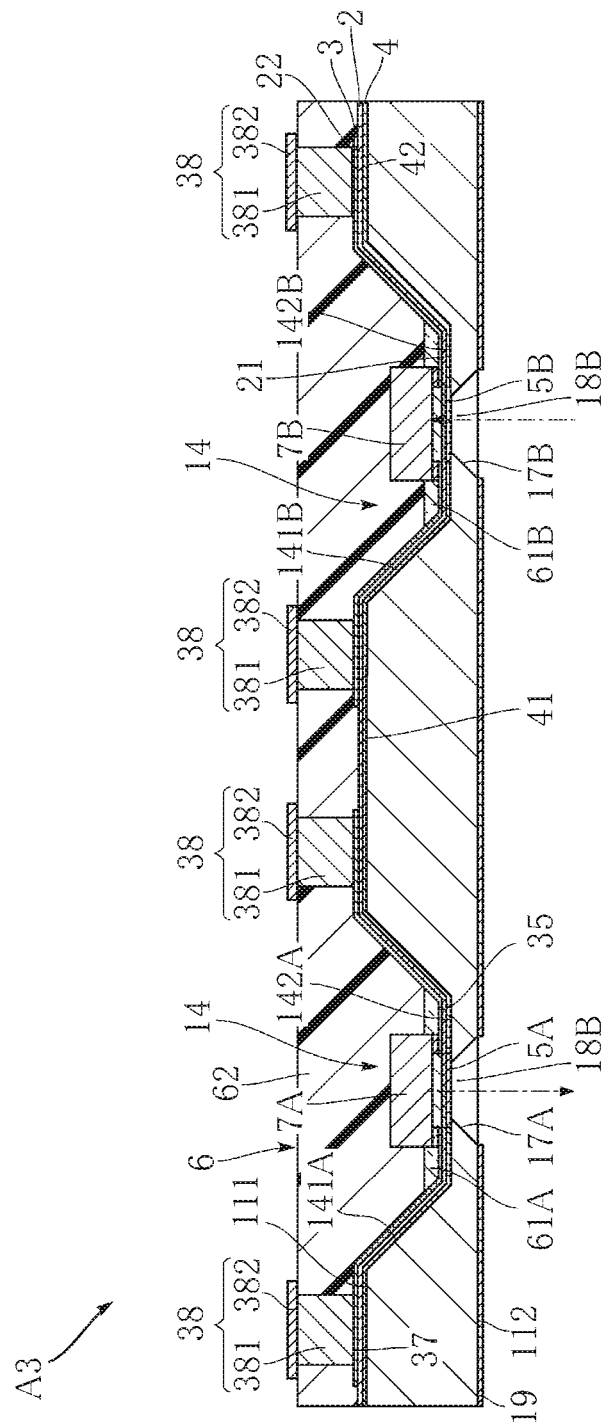
FIG. 26 is a cross-sectional view showing an optical semiconductor device according to the third embodiment of the present invention.

FIG. 26 shows an optical semiconductor device according to the third embodiment of the present invention. An optical semiconductor device A3 of this embodiment does not include a control element 8, a control element 8A and a control element 8B. Along with this, the two recesses 14 are the configuration having a first side surface 141 of a light-emitting side recess and a bottom surface 142A of the light-emitting side, or the configuration having a first side surface 141B of a light-receiving side and a bottom surface 142B of the light-receiving side. Further, in a sealing resin 6, a light-emitting side transparent resin 61A and a light-receiving side transparent resin 61B are in contact with a light-shielding resin 62. In this embodiment, some terminals are disposed between the two recesses 14. More specifically, terminals 38 are disposed in two rows between the two recesses 14 in the direction deep into the figure.

According to this embodiment, the minimization and the increase of detection precision of the optical semiconductor device A3 can be achieved.

Figure 27:
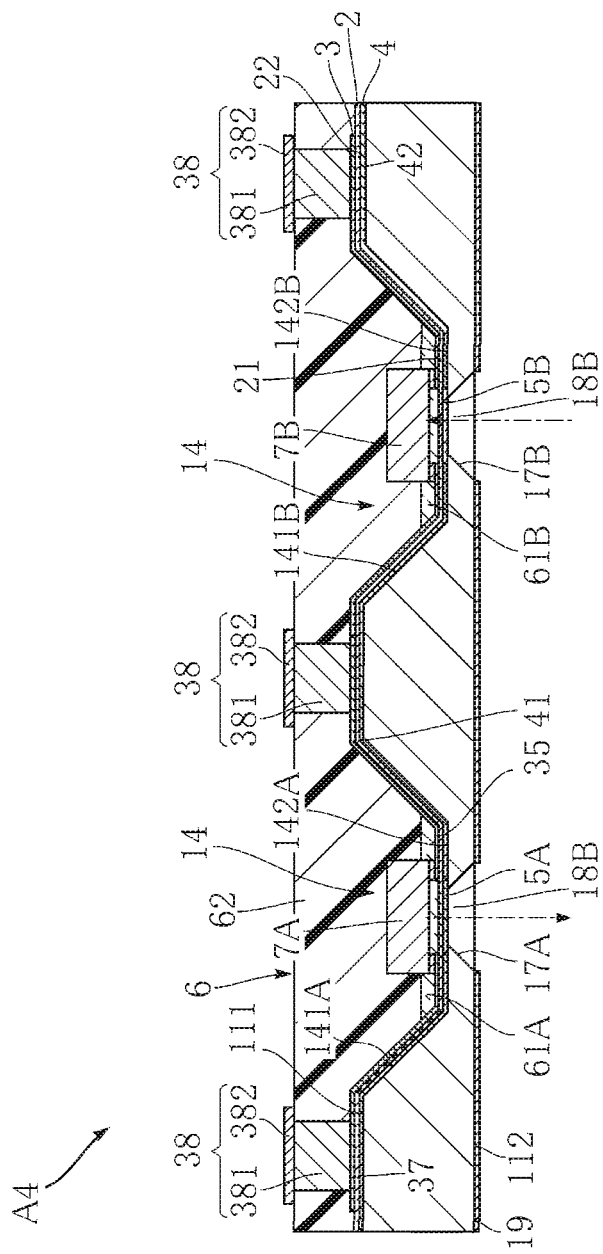
FIG. 27 is a cross-sectional view showing an optical semiconductor device according to the fourth embodiment of the present invention.

FIG. 27 shows an optical semiconductor device according to the fourth embodiment of the present invention. With regard to an optical semiconductor device A4 of this embodiment, to be different from the optical semiconductor device A3, the arrangement of the terminals 38 between the two recesses 14 can be listed. In this embodiment, between two recesses 14, some terminals 38 are disposed in one row in the direction deep into the figure.

According to this embodiment, the minimization and the increase of detection precision of the optical semiconductor device A4 can be achieved.

Figure 28:
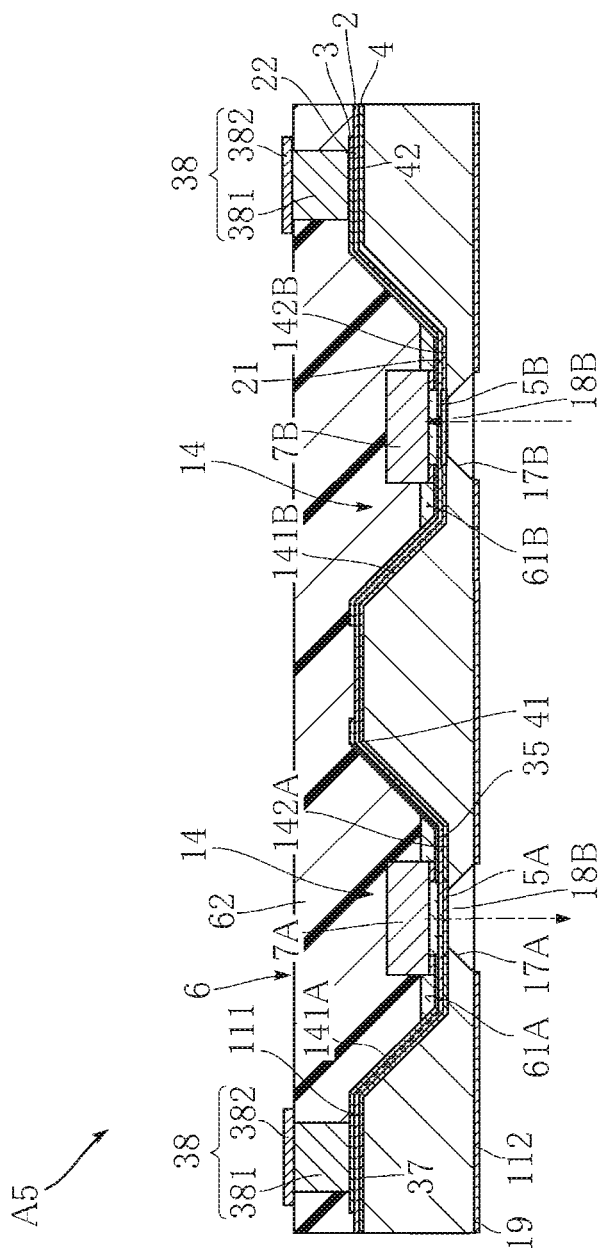
FIG. 28 is a cross-sectional view showing an optical semiconductor device according to the fifth embodiment of the present invention.

FIG. 28 shows an optical semiconductor device according to the fifth embodiment of the present invention. With regard to an optical semiconductor device A5 of this embodiment, to be different from the optical semiconductor device A3 and the optical semiconductor device A4, the arrangement of the terminals 38 between the two recesses 14 can be listed. In this embodiment, no terminals 38 are disposed between two recesses 14.

According to this embodiment, the minimization and the increase of detection precision of the optical semiconductor device A5 can be achieved.

Figure 29:
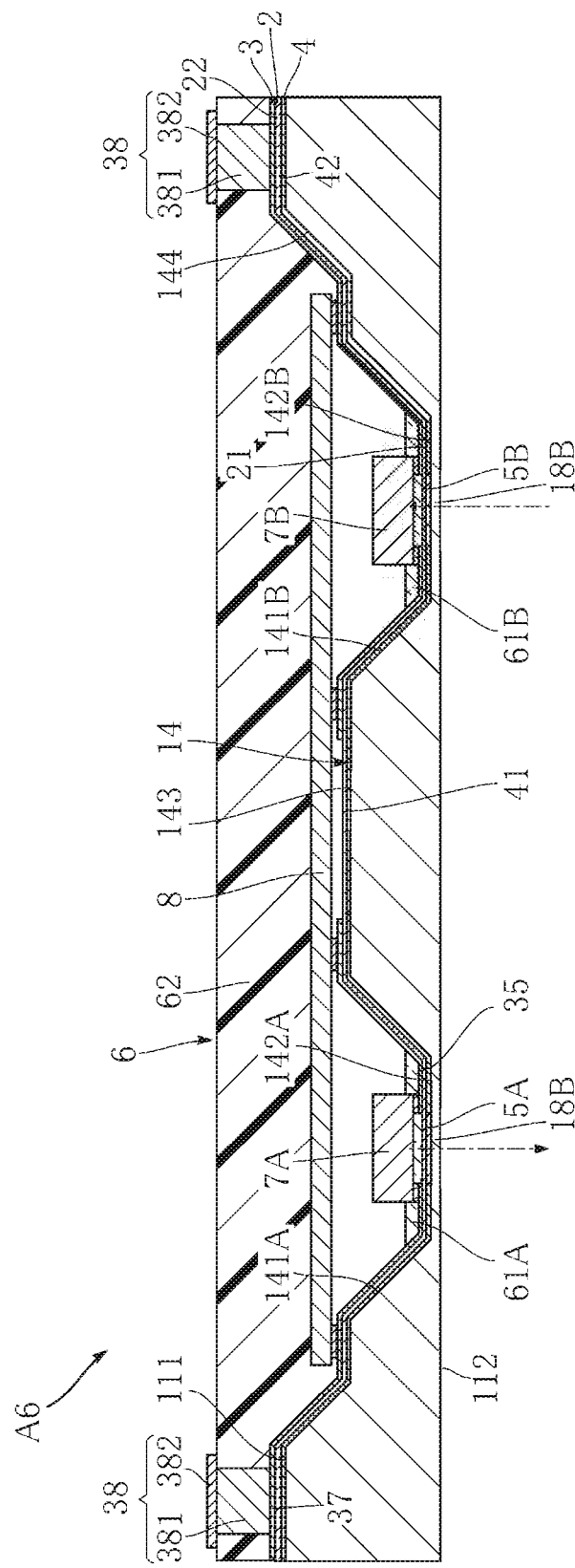
FIG. 29 is a cross-sectional view showing an optical semiconductor device according to the sixth embodiment of the present invention.
Figure 30:
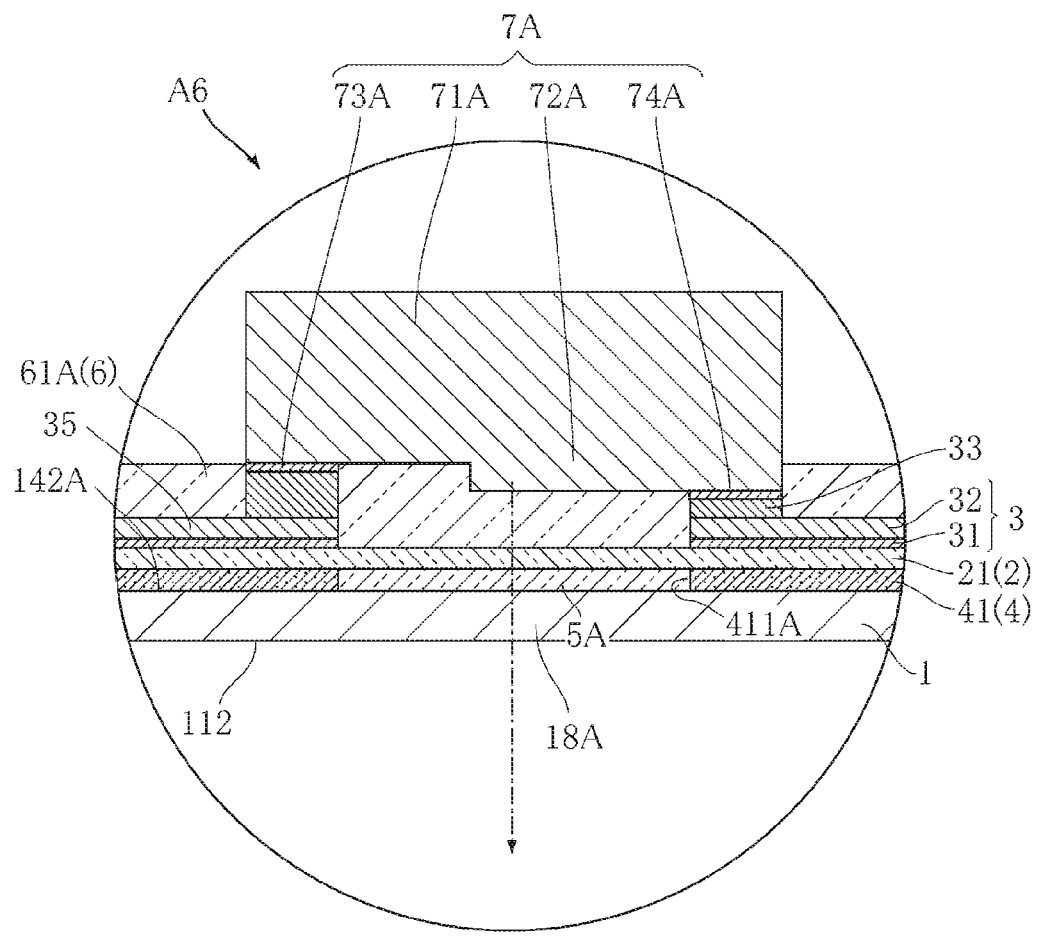
FIG. 30 is an enlarged cross-sectional view showing a main portion of the optical semiconductor device in FIG. 29.

FIG. 29 and FIG. 30 show an optical semiconductor device according to the sixth embodiment of the present invention. The configuration of a light-emitting side transparent portion 18A and a light-receiving side transparent portion 18B of an optical semiconductor device A6 in this embodiment is different from that in the above embodiments. Further, in addition to the light-emitting side transparent portion 18A and the light-receiving side transparent portion 18B of the optical semiconductor device A6, the configuration of the optical semiconductor device A6 is similar to the configuration of the optical semiconductor device A1. However, this is an example of the optical semiconductor device A6, the configuration similar to the optical semiconductor devices A2~A5 also applies.

In this embodiment, either light-emitting side through hole 17A or light-receiving side through hole 17B is not formed at a substrate 1. A thickness of the portion between a bottom surface 142A of the light-emitting side and a back surface 112 is set as a thickness for the light from a semiconductor light-emitting element 7A to completely pass through. Further, a thickness of the portion between a bottom surface 142B of the light-emitting side and the back surface 112 is set as a thickness for the light toward a semiconductor light-emitting element 7B to completely pass through. Accordingly, in this embodiment, the light-emitting side transparent portion 18A includes a light-emitting side transparent film 5A and a part of the substrate 1, and the light-receiving side transparent portion 18B includes a light-receiving side transparent film 5B and a part of the substrate 1.

According to this embodiment, the minimization and the increase of detection precision of the optical semiconductor device A6 can be achieved. Further, since there is no light-emitting side through hole 17A and the light-receiving side through hole 17B, the steps for forming the optical semiconductor device A6 can be simplified. Further, this is beneficial for thinning the optical semiconductor device A6.

The optical semiconductor device of the present invention is not limited to the above embodiments. The specific configuration of each part of the optical semiconductor device of the present invention can be freely designed and changed.

What is claimed is:

1. An optical semiconductor device, comprising:
   a substrate, including a semiconductor material, and including a main surface and a back surface facing oppositely in a thickness direction;
   a semiconductor light-emitting element at the substrate;
   a semiconductor light-receiving element at the substrate;
   a conductive layer, conducting the semiconductor light-emitting element and the semiconductor light-receiving element; and
   an insulating layer between at least a portion of the conductive layer and the substrate;
   wherein the substrate includes a recess recessed from the main surface and including a bottom surface of a light-emitting side recess where the semiconductor light-emitting element is disposed, and a bottom surface of a light-receiving side recess where the semiconductor light-receiving element is disposed; a light-emitting side transparent portion for light from the semiconductor light-emitting element to pass through the bottom surface of the light-emitting side recess to the back surface; and a light-receiving side transparent portion for light from the back surface to pass through the bottom surface of the light-receiving side recess to the semiconductor light-receiving element.

2. The optical semiconductor device according to claim 1, wherein the bottom surface of the light-emitting side recess and the bottom surface of the light-receiving side recess are separated from each other.

3. The optical semiconductor device according to claim 2, wherein the recess of the substrate includes a first side surface of the light-emitting side recess rising from the bottom surface of the light-emitting side recess.

4. The optical semiconductor device according to claim 3, wherein the recess of the substrate includes a first side surface of the light-receiving side recess rising from the bottom surface of the light-receiving side recess.

5. The optical semiconductor device according to claim 4, comprising a light-shielding layer between the substrate and at least a portion of the insulating layer, and the light-shielding layer shields light from the semiconductor light-emitting element and light to be received by the semiconductor light-receiving element.

6. The optical semiconductor device according to claim 5, wherein the light-shielding layer includes a compound of a metal and a semiconductor constituting the substrate.

7. The optical semiconductor device according to claim 6, wherein the light-shielding layer includes a compound of Ti and Si.

8. The optical semiconductor device according to claim 5, wherein the light-shielding layer includes a metal.

9. The optical semiconductor device according to claim 8, wherein the light-shielding layer includes Ti.

10. The optical semiconductor device according to claim 5, wherein the light-shielding layer includes a light-shielding portion of a recess inner surface, and the light-shielding portion of the recess inner surface is formed on the recess of the substrate.

11. The optical semiconductor device according to claim 10, wherein the light-shielding portion of the recess inner surface includes a light-emitting side opening for light from the semiconductor light-emitting element to pass through, and the light-emitting side opening accommodates the light-emitting side transparent portion from a top view perspective.

12. The optical semiconductor device according to claim 11, wherein the inner surface light-shielding portion of the recess inner surface includes a light-receiving side opening for light toward the semiconductor light-receiving element to pass through, and the light-receiving side opening accommodates the light-receiving side transparent portion from a top view perspective.

13. The optical semiconductor device according to claim 12, comprising a light-emitting side transparent film in the light-emitting side transparent portion, and the light-emitting side opening of the light-shielding layer accommodates the light-emitting side transparent film from a top view perspective.

14. The optical semiconductor device according to claim 13, wherein an outer edge of the light-emitting side transparent film aligns with an inner edge of the light-emitting side opening of the light-shielding layer.

15. The optical semiconductor device according to claim 13, wherein the light-emitting side transparent film includes $SiO_2$.

16. The optical semiconductor device according to claim 13, comprising a light-receiving side transparent film in the light-receiving side transparent portion, and the light-receiving side opening of the light-shielding layer accommodates the light-receiving side transparent film from a top view perspective.

17. The optical semiconductor device according to claim 16, wherein an outer edge of the light-receiving side transparent film aligns with an inner edge of the light-receiving side opening of the light-shielding layer.

18. The optical semiconductor device according to claim 16, wherein the light-receiving side transparent film includes $SiO_2$.

19. The optical semiconductor device according to claim 16, wherein the substrate includes a light-emitting side through hole in the light-emitting side transparent portion, wherein the light-emitting side through hole passes from the bottom surface of the light-emitting side recess to the back surface, and the light-emitting side opening of the light-shielding layer accommodates at least a portion of the light-emitting side through hole from a top view perspective.

20. The optical semiconductor device according to claim 19, wherein the light-emitting side through hole includes a light-emitting side main surface opening disposed on the main surface side and a light-emitting side back surface opening disposed on the back surface side in the thickness direction of the substrate.

* * * * *